US012681111B2

(12) United States Patent
Karasawa et al.

(10) Patent No.: US 12,681,111 B2
(45) Date of Patent: Jul. 14, 2026

(54) EXCITATION CIRCUIT, CURRENT SENSOR, AND MEASURING DEVICE

(71) Applicant: HIOKI E.E. CORPORATION, Nagano (JP)

(72) Inventors: Yuki Karasawa, Nagano (JP); Kenta Ikeda, Nagano (JP); Koki Nakazawa, Nagano (JP); Peiyu Xia, Nagano (JP); Kimihiko Yamagishi, Nagano (JP)

(73) Assignee: HIOKI E.E. CORPORATION, Nagano (JP)

( * ) Notice: Subject to any disclaimer, the term of this patent is extended or adjusted under 35 U.S.C. 154(b) by 196 days.

(21) Appl. No.: 18/838,870

(22) PCT Filed: Feb. 16, 2023

(86) PCT No.: PCT/JP2023/005380
§ 371 (c)(1),
(2) Date: Aug. 15, 2024

(87) PCT Pub. No.: WO2023/157902
PCT Pub. Date: Aug. 24, 2023

(65) Prior Publication Data
US 2025/0155527 A1 May 15, 2025

(30) Foreign Application Priority Data
Feb. 18, 2022 (JP) ................................ 2022-023808

(51) Int. Cl.
*G01R 33/04* (2006.01)
*G01R 19/00* (2006.01)
(52) U.S. Cl.
CPC ......... *G01R 33/04* (2013.01); *G01R 19/0092* (2013.01)

(58) Field of Classification Search
CPC .. G01R 19/0092; G01R 15/185; G01R 33/04; G01R 15/20; G01R 15/18
See application file for complete search history.

(56) References Cited

U.S. PATENT DOCUMENTS

| | | | |
|---|---|---|---|
| 6,954,060 B1 | 10/2005 | Edel | |
| 2015/0276816 A1* | 10/2015 | Yoshida | ............. G01R 19/0092 324/244 |
| 2017/0115328 A1* | 4/2017 | Seki | ................... G01R 19/0092 |

FOREIGN PATENT DOCUMENTS

| | | | | |
|---|---|---|---|---|
| CN | 115389807 A | * | 11/2022 | ............. G01R 15/20 |
| JP | 63-65374 A | | 3/1988 | |

(Continued)

OTHER PUBLICATIONS

Microfilm of the specification and drawings annexed to the request of Japanese Utility Model Application No. 072533/1980 (Laid-open No. 174060/1981) (Yokoga Wa Electric Works. Ltd.) Dec. 22, 1981 (Dec. 22, 1981). entire text. all drawings.

*Primary Examiner* — Daniel R Miller
(74) *Attorney, Agent, or Firm* — Conley Rose, P.C.

(57) ABSTRACT

An excitation circuit includes a first operational amplifier that supplies a first excitation current to a first coil constituting a first flux gate, and a second operational amplifier that supplies a second excitation current to a second coil constituting a second flux gate. The excitation circuit further includes a signal generation circuit that generates input signals for the first operational amplifier and the second operational amplifier. The signal generation circuit includes a third operational amplifier that generates an inverted voltage or a non-inverted voltage based on an AC excitation voltage for exciting the pair of flux gates as an input signal for the first operational amplifier, and a fourth operational amplifier that generates an inverted voltage or a non-in- (Continued)

verted voltage based on the AC excitation voltage as an input signal for the second operational amplifier.

11 Claims, 13 Drawing Sheets

(56)                    References Cited

FOREIGN PATENT DOCUMENTS

| | | | |
|---|---|---|---|
| JP | 2001-228181 | A | 8/2001 |
| JP | 2004-245597 | A | 9/2004 |
| JP | 2014-122879 | A | 7/2014 |
| JP | 2018-179689 | A | 11/2018 |
| WO | 2013/088766 | A1 | 6/2013 |

* cited by examiner

[FIG. 1]
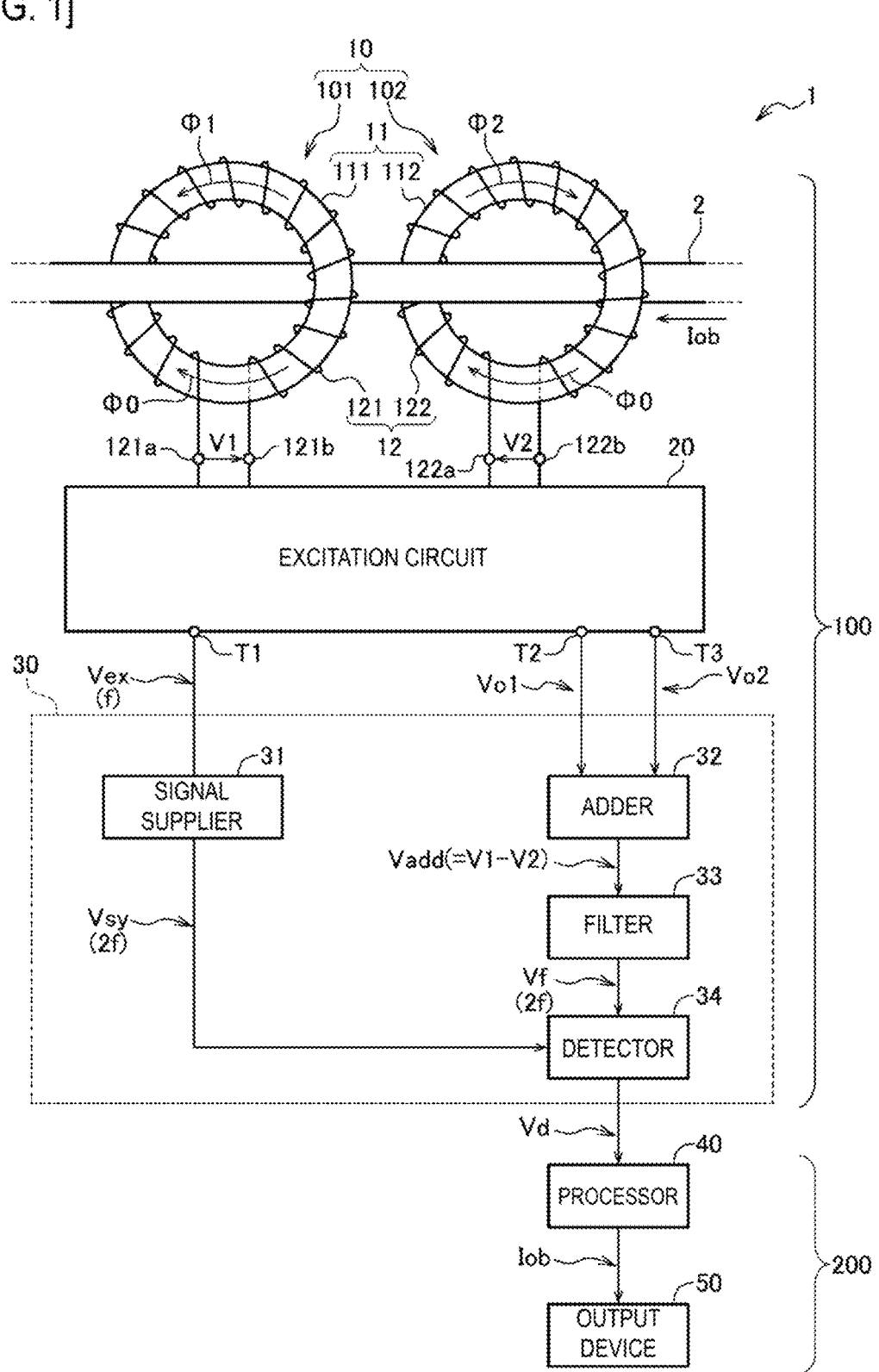

[FIG. 2]
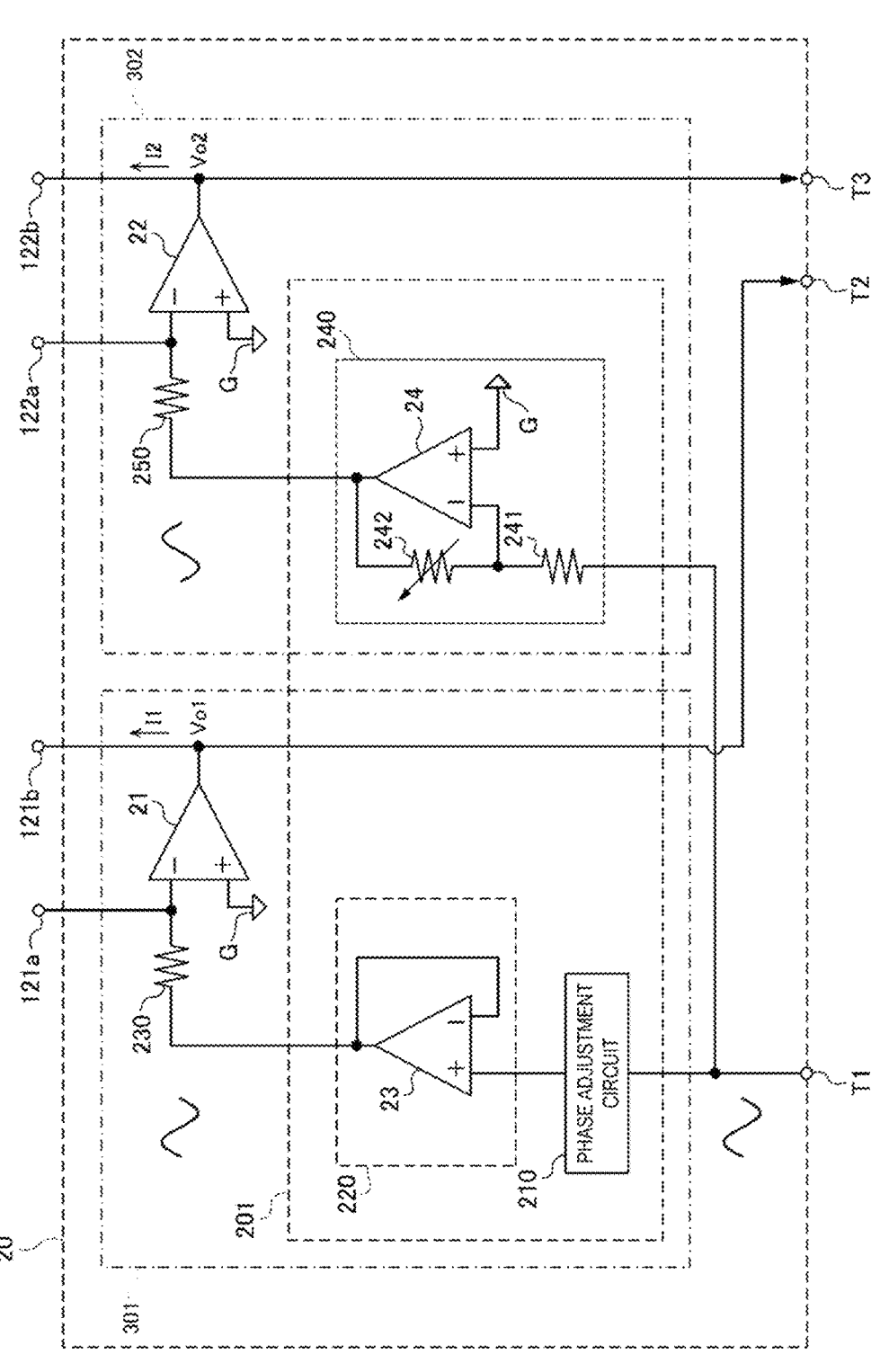

[FIG. 3]
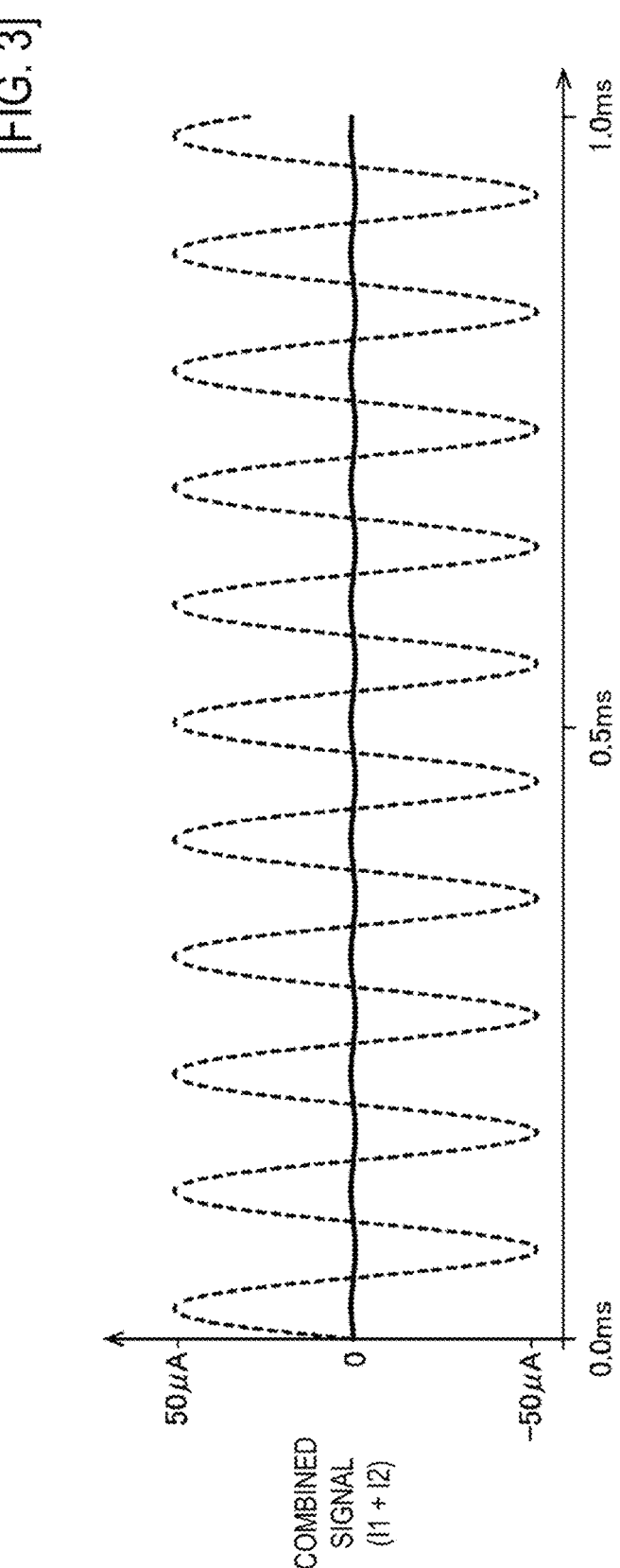

[FIG. 4]
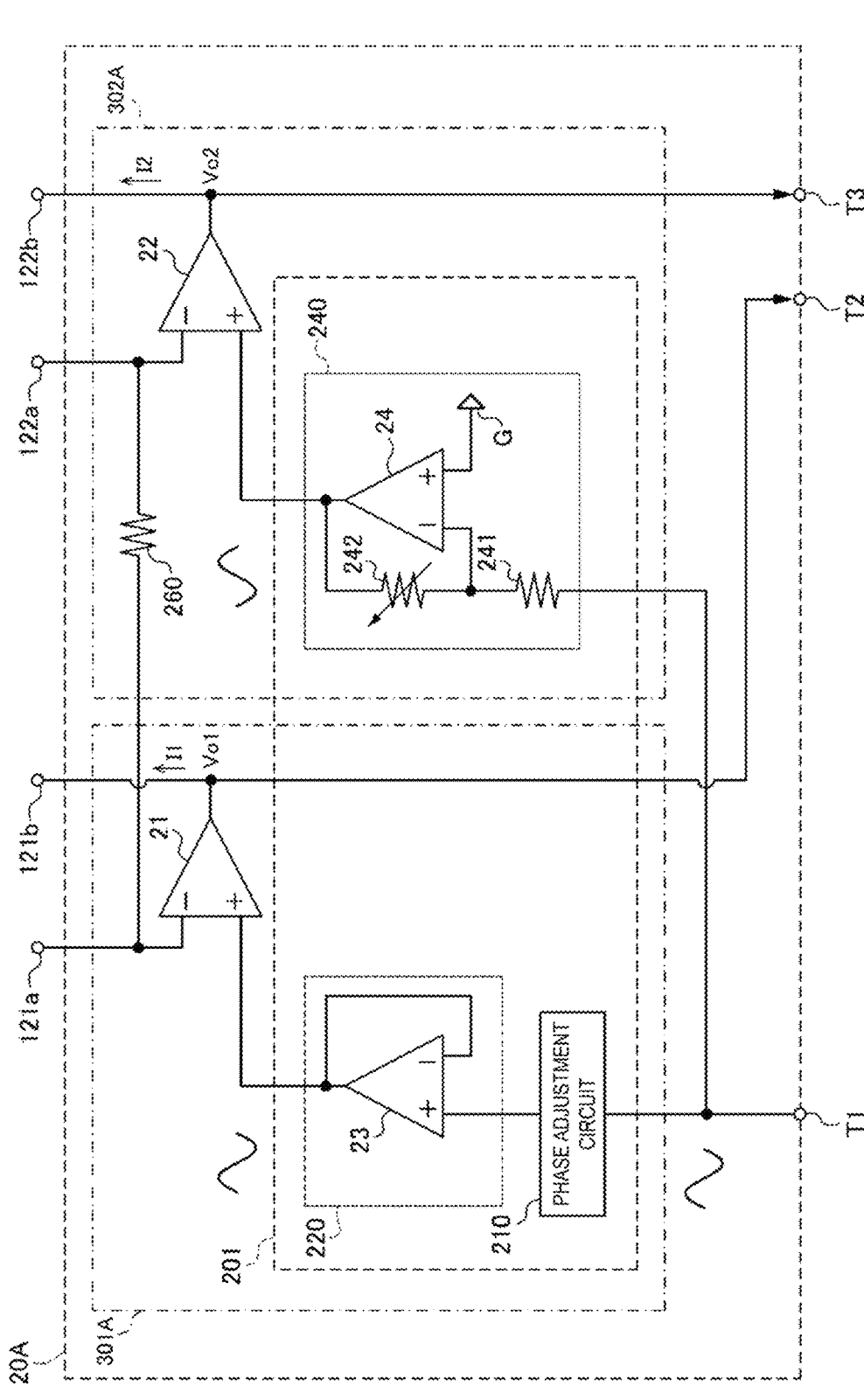

[FIG. 5]
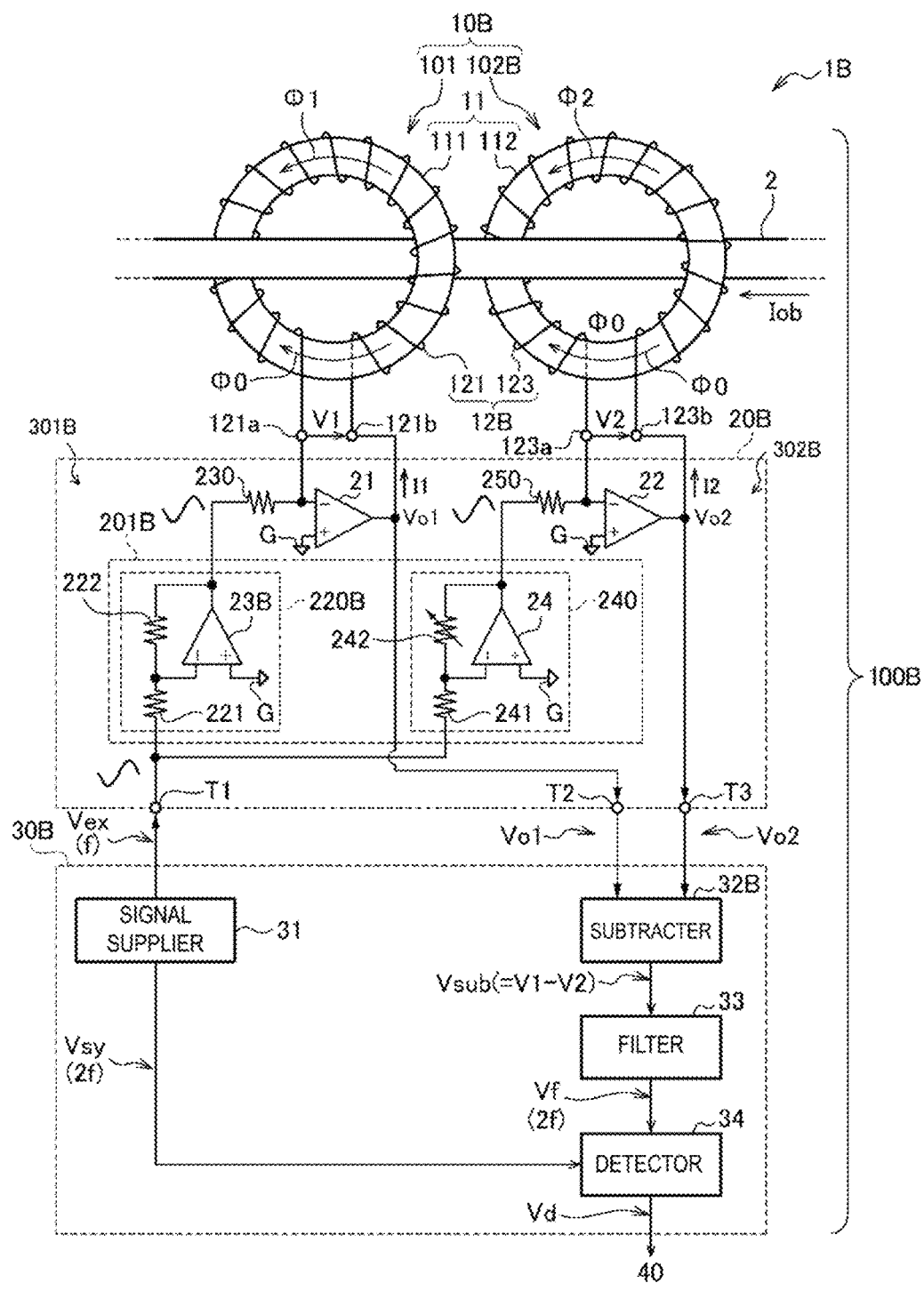

[FIG. 6]
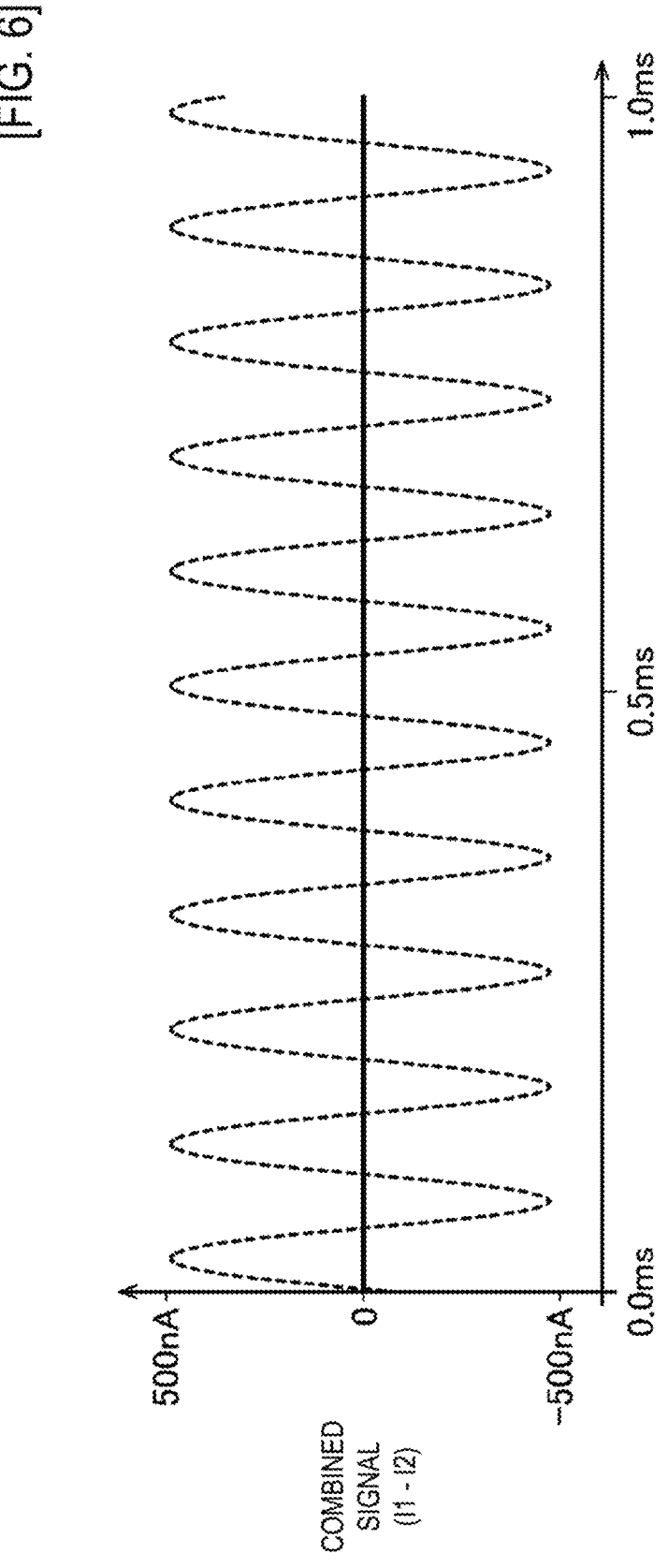

[FIG. 7]
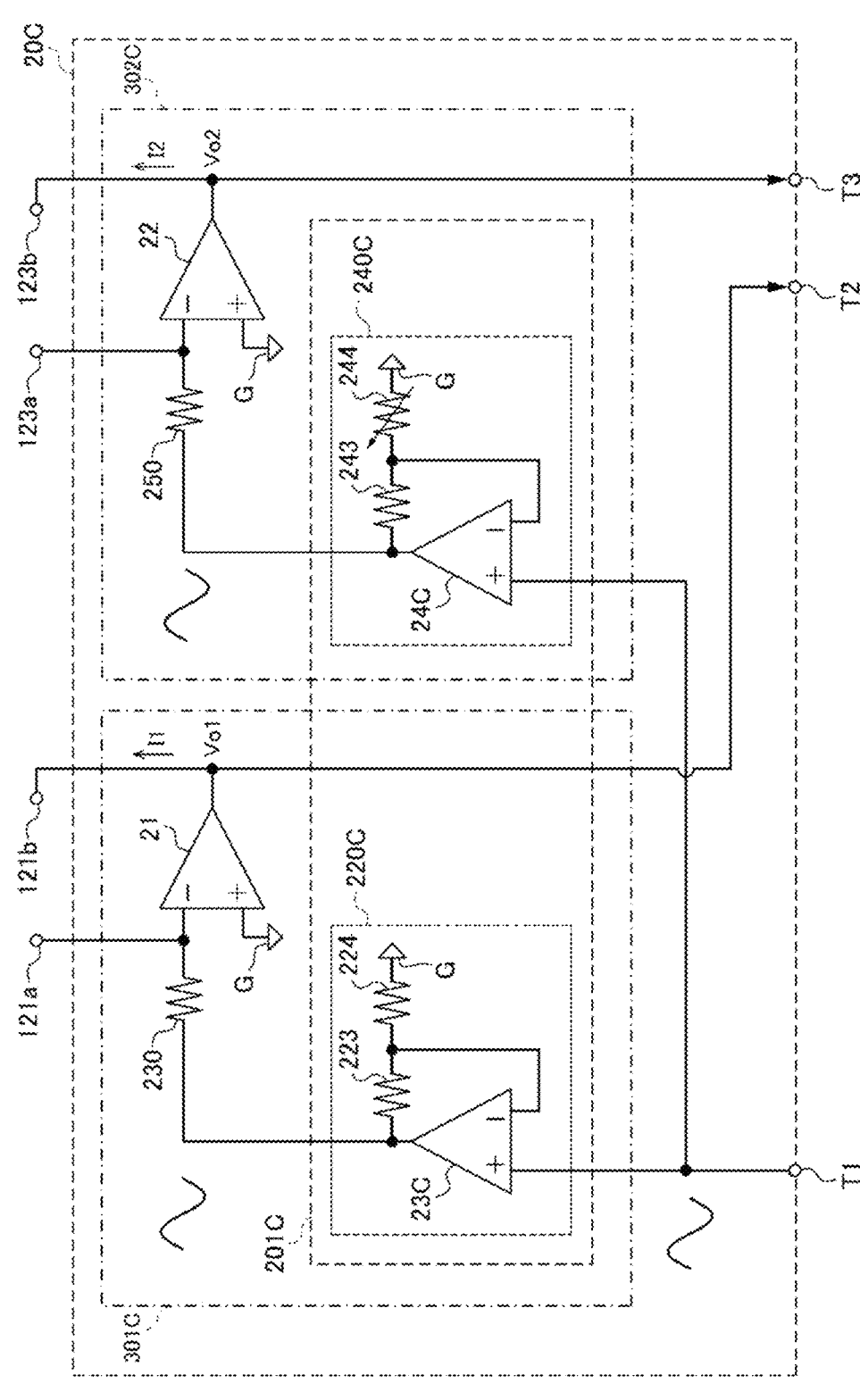

[FIG. 11]
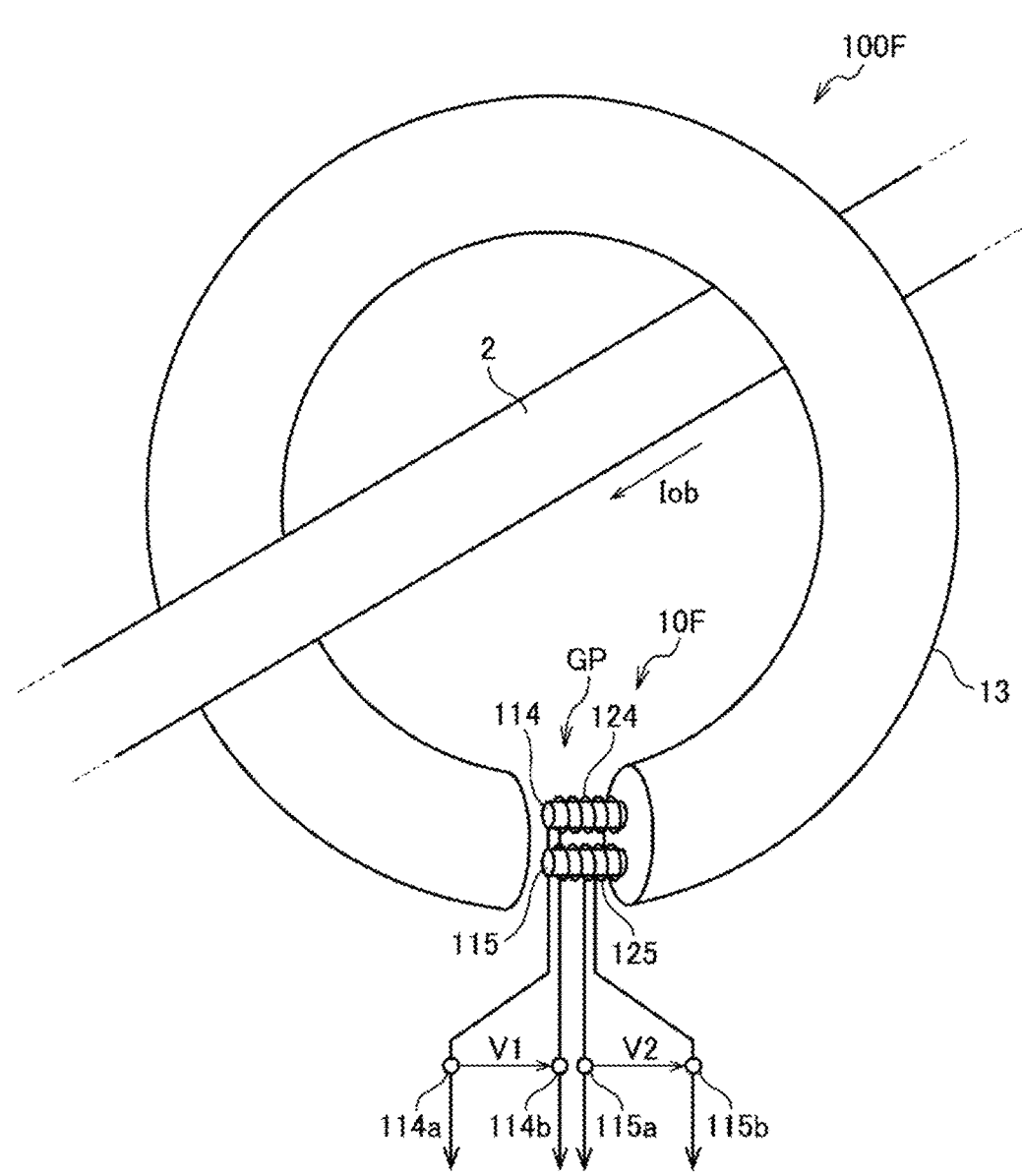

[FIG. 12]
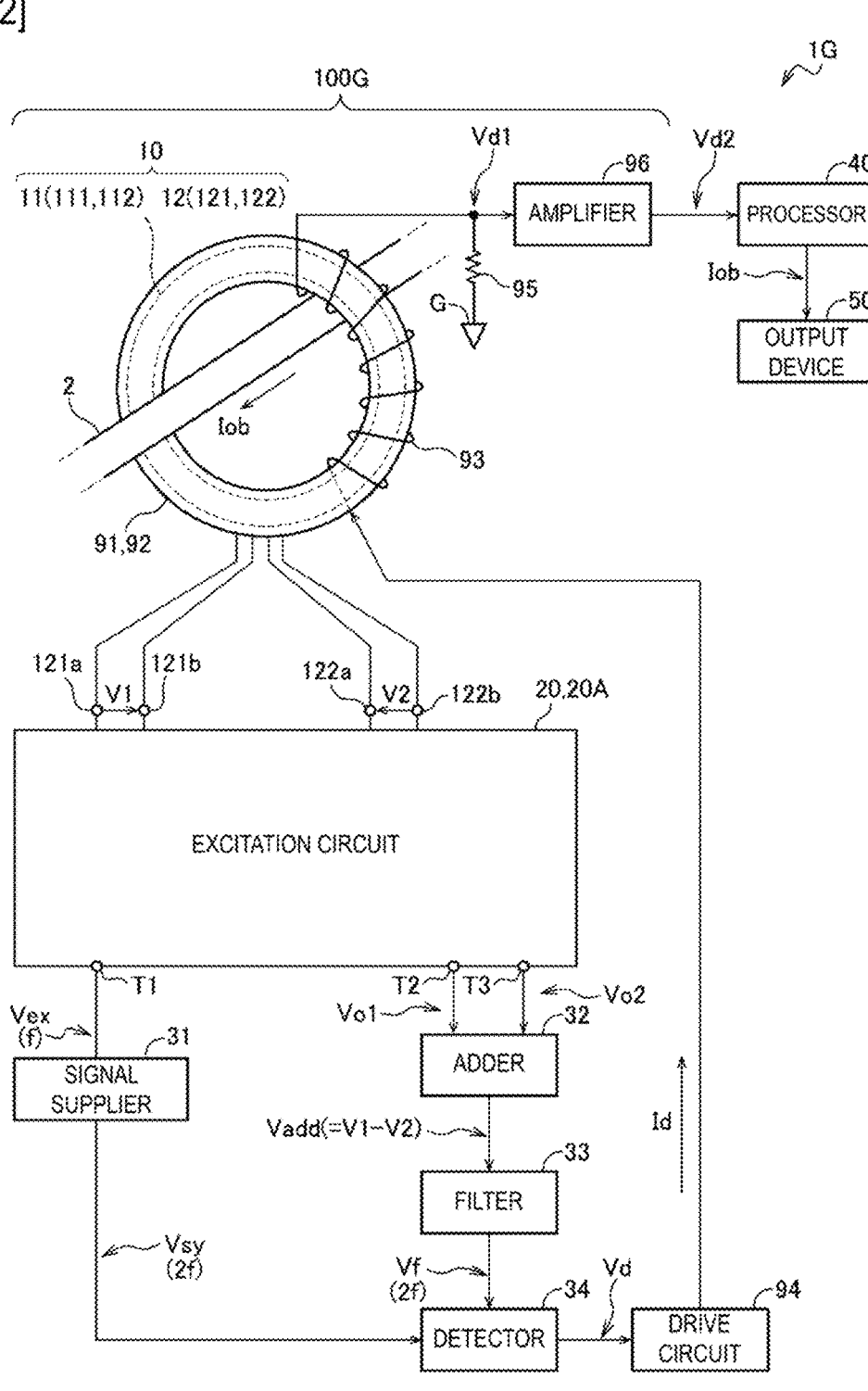

EXCITATION CIRCUIT, CURRENT SENSOR, AND MEASURING DEVICE

TECHNICAL FIELD

The present invention relates to an excitation circuit for exciting a flux gate, a current sensor, and a measuring device.

BACKGROUND ART

JP 2018-179689 A discloses a flux-gate type current sensor including a first operational amplifier in which a first excitation coil wound around a first core is connected between an inverting input terminal and an output terminal, and a second operational amplifier in which a second excitation coil wound around a second core is connected between an inverting input terminal and an output terminal. In such a current sensor, the first core and the first excitation coil constitute a first flux gate, and the second core and the second excitation coil constitute a second flux gate.

In the above-described current sensor, a non-inverting input terminal of the first operational amplifier and the inverting input terminal of the second operational amplifier are connected to each other via a resistor. An AC excitation voltage is supplied to the non-inverting input terminal of the first operational amplifier in a state in which a non-inverting input of the second operational amplifier is set to a ground potential. In addition, output signals of a pair of operational amplifiers composed of the first operational amplifier and the second operational amplifier are added.

SUMMARY OF INVENTION

In the above-described circuit configuration, a phase difference occurs between excitation currents supplied to a pair of excitation coils composed of the first excitation coil and the second excitation coil due to an operation delay of one operational amplifier of the pair of operational amplifiers with respect to the other operational amplifier.

As a result, in a combined signal obtained by combining the output signals of the pair of operational amplifiers, a part of magnetic flux components of magnetic fluxes generated at a pair of flux gates composed of the first flux gate and the second flux gate due to the AC excitation voltage, which is the magnetic fluxes remaining without being canceled by each other, is superimposed as an excitation noise on a detection signal indicating the magnitude of a current flowing through a measurement object.

The present invention has been made in view of such a problem, and an object of the present invention is to suppress a difference between magnetic fluxes generated at a pair of flux gates due an AC excitation voltage.

In an aspect of the present invention, an excitation circuit that excites a pair of flux gates for detecting a physical quantity of a measurement object includes a first operational amplifier that supplies a first excitation current to a first coil constituting a first flux gate, and a second operational amplifier that supplies a second excitation current to a second coil constituting a second flux gate. The excitation circuit further includes a signal generation circuit that generates an input signal for the first operational amplifier and an input signal for the second operational amplifier. The signal generation circuit includes a third operational amplifier that generates an inverted voltage or a non-inverted voltage based on an AC excitation voltage for exciting the pair of the flux gates as an input signal for the first operational amplifier, and a fourth operational amplifier that generates an inverted voltage or a non-inverted voltage based on the AC excitation voltage as an input signal for the second operational amplifier.

According to the above aspect, a pair of the excitation circuits that excite the pair of the flux gates are configured to operate independently of each other, and the operational amplifiers of the pair of the excitation circuits are configured to be symmetrical to each other. As a result, in each of the excitation circuits, a signal delay does not occur due to the influence of the other excitation circuit, and in both of the excitation circuits, the operational amplifiers that affect the delay of the excitation currents perform the same operation. Accordingly, a deviation of a phase difference between the pair of the excitation currents from a reference value is suppressed, and thus a difference between the magnetic fluxes generated at the pair of the flux gates can be suppressed as compared with a circuit configuration in which a pair of excitation circuits do not operate independently of each other.

BRIEF DESCRIPTION OF DRAWINGS

FIG. 1 is a diagram illustrating a configuration of a measuring device including an excitation circuit according to a first embodiment of the present invention.

FIG. 2 is a circuit diagram illustrating a configuration example of the excitation circuit according to the first embodiment.

FIG. 3 is a diagram illustrating an example of an excitation noise contained in an output signal of a detector.

FIG. 4 is a circuit diagram illustrating a configuration of an excitation circuit according to a second embodiment.

FIG. 5 is a diagram illustrating a configuration of a current sensor according to a third embodiment.

FIG. 6 is a diagram illustrating an example of an excitation noise contained in an output signal of the detector.

FIG. 7 is a circuit diagram illustrating a first modification example of an excitation circuit constituting a current sensor.

FIG. 8 is a circuit diagram illustrating a second modification example of an excitation circuit constituting a current sensor.

FIG. 9A is a circuit diagram illustrating a configuration example of a signal supplier according to a fourth embodiment.

FIG. 9B is a circuit diagram illustrating another example of a configuration of the signal supplier.

FIG. 10 is a diagram illustrating a first modification example of a measuring device.

FIG. 11 is a diagram illustrating a second modification example of the measuring device.

FIG. 12 is a diagram illustrating a third modification example of the measuring device.

DESCRIPTION OF EMBODIMENTS

Embodiments of the present invention will be described below with reference to the accompanying drawings. In the present specification, the same or similar elements are denoted by the same reference signs.

First Embodiment

FIG. 1 is a diagram illustrating a configuration of a measuring device including an excitation circuit according to a first embodiment. FIG. 2 is a circuit diagram illustrating a configuration of the excitation circuit according to the first embodiment.

A measuring device 1 illustrated in FIG. 1 is a device for measuring a physical quantity generated at a measurement object 2. The measurement object 2 is, for example, an electric path through which a current flows. Examples of the electric path include a single-phase or three-phase power cable. Examples of the physical quantity of the measurement object 2 include a current value, a voltage value, a magnetic flux value, and a power value.

The measuring device 1 according to the first embodiment measures the magnitude of a current flowing though the measurement object 2. The measuring device 1 includes a current sensor 100 and a measurement section 200.

The current sensor 100 is a flux-gate type current sensor for detecting a physical quantity of the measurement object 2. The current sensor 100 of the first embodiment includes a pair of flux gates 10, an excitation circuit 20, and a detector 30.

The pair of flux gates 10 include a pair of magnetic cores 11 through which the measurement object 2 is inserted, and a pair of excitation coils 12 wound around the pair of magnetic cores 11.

In the first embodiment, the pair of flux gates 10 are composed of a flux gate 101 as a first flux gate and a flux gate 102 as a second flux gate.

The pair of magnetic cores 11 are composed of a magnetic core 111 as a first core and a magnetic core 112 as a second core. The pair of excitation coils 12 include an excitation coil 121 as a first coil and an excitation coil 122 as a second coil.

The pair of magnetic cores 11 are formed in an annular shape so that the measurement object 2 can be inserted therethrough. The annular shape here includes a circular shape, an elliptical shape, a rectangular shape, a polygonal shape, and the like. Each of the magnetic cores 11 of the first embodiment is formed in an annular shape.

The excitation coils 12 may be wound so as to entirely cover the magnetic cores 11, respectively, or may be wound so as to partially cover the magnetic cores 11, respectively. The winding directions of the pair of excitation coils 12 may be the same as or different from each other.

Regarding the pair of excitation coils 12 according to the first embodiment, the winding direction of the excitation coil 121 wound around the entirety of the magnetic core 111 and the winding direction of the excitation coil 122 wound around the entirety of the magnetic core 112 are the same direction. In addition, the number of turns of the excitation coil 121 is equal to the number of turns of the excitation coil 122.

The pair of magnetic cores 11 may be made of, for example, an iron material such as Permalloy, and may have a hollow structure. In addition, the pair of magnetic cores 11 may be configured to be a split type that can be opened and closed, or may be configured to be a through type (non-split type) that cannot be opened and closed.

The excitation circuit 20 illustrated in FIG. 2 is an electric circuit for exciting the pair of flux gates 10 for detecting a physical quantity of the measurement object 2. The excitation circuit 20 includes a pair of operational amplifiers 21, 22 and a signal generation circuit 201. The signal generation circuit 201 includes at least a pair of operational amplifiers 23, 24.

The operational amplifier 21 and the operational amplifier 23 constitute an excitation circuit 301 as a first excitation circuit, and the operational amplifier 22 and the operational amplifier 24, which correspond to the operational amplifier 21 and the operational amplifier 23, constitute an excitation circuit 302 as a second excitation circuit. That is, the excitation circuit 20 is a pair of circuits for exciting the pair of flux gates 10, and includes a pair of the excitation circuits 301, 302 symmetrically including the operational amplifiers 21 to 24.

The operational amplifier 21 serves as a first operational amplifier that supplies an excitation current I1, which is a first excitation current, to the excitation coil 121 constituting the flux gate 101.

The flux gate 101 is disposed in a negative feedback path extending between an inverting input terminal (−) and an output terminal of the operational amplifier 21.

In the first embodiment, a ground potential G is connected to a non-inverting input terminal (+) of the operational amplifier 21 as a reference potential. One end 121*a* of the excitation coil 121 is connected to the inverting input terminal (−) of the operational amplifier 21, and one end 121*b* of the excitation coil 121 is connected to the output terminal of the operational amplifier 21. Accordingly, the excitation current I1 flows from the output terminal to the inverting input terminal (−) of the operational amplifier 21.

The operational amplifier 22 serves as a second operational amplifier that supplies an excitation current I2, which is a second excitation current, to the excitation coil 122 constituting the flux gate 102. The operational amplifier 22 has the same configuration as the operational amplifier 21.

The flux gate 102 is disposed in a negative feedback path extending between an inverting input terminal (−) and an output terminal of the operational amplifier 22.

In the first embodiment, the ground potential G is connected to a non-inverting input terminal (+) of the operational amplifier 22 as the reference potential. One end 122*a* of the excitation coil 122 is connected to the inverting input terminal (−) of the operational amplifier 22, and one end 122*b* of the excitation coil 122 is connected to the output terminal of the operational amplifier 22. Accordingly, the excitation current I2 flows from the output terminal to the inverting input terminal (−) of the operational amplifier 22.

The signal generation circuit 201 generates an input signal to be input to the operational amplifier 21 and an input signal to be input to the operational amplifier 22 in order to suppress a difference between an AC magnetic flux φ1 (see FIG. 1) generated by the excitation current I1 and an AC magnetic flux φ2 (see FIG. 1) generated by the excitation current I2.

The signal generation circuit 201 includes a phase adjustment circuit 210, and a voltage follower circuit 220 composed of the operational amplifier 23. The signal generation circuit 201 further includes an inverting amplification circuit 240 composed of the operational amplifier 24. The inverting amplification circuit 240 further includes a gain adjustment resistor 241 and a gain adjustment variable resistor 242.

The phase adjustment circuit 210 is a circuit capable of adjusting the phase of the input signal for the operational amplifier 21. The phase adjustment circuit 210 is composed of, for example, a low-pass filter. An input terminal of the phase adjustment circuit 210 is connected to an input terminal T1 of the excitation circuit 20.

In the first embodiment, upon receiving an AC excitation voltage Vex (see FIG. 1) for exciting the pair of flux gates 10, the phase adjustment circuit 210 adjusts the phase of the AC excitation voltage Vex. The phase adjustment circuit 210 outputs the AC excitation voltage Vex with adjusted phase to the input terminal of the operational amplifier 23.

The operational amplifier 23 serves as a third operational amplifier that generates, based on the AC excitation voltage Vex, an inverted voltage in which the positive and negative polarities of the AC excitation voltage Vex are inverted or a non-inverted voltage in which the positive and negative polarities of the AC excitation voltage Vex are not inverted. The operational amplifier 23 outputs the generated AC voltage as an input signal for the operational amplifier 21.

The operational amplifier 23 according to the first embodiment constitutes the voltage follower circuit 220. The non-inverting input terminal (+) of the operational amplifier 23 is connected to the output terminal of the phase adjustment circuit 210, and the inverting input terminal (−) and the output terminal of the operational amplifier 23 are connected to each other.

Accordingly, when the operational amplifier 23 receives the AC excitation voltage Vex with adjusted phase from its own non-inverting input terminal (+), the operational amplifier 23 outputs a non-inverted voltage in which the positive and negative polarities of the AC excitation voltage Vex are not inverted, to a current adjustment resistor 230.

The current adjustment resistor 230 is a resistance element for adjusting the magnitude of a current to be input to the inverting input terminal (−) of the operational amplifier 21. The current adjustment resistor 230 is composed of, for example, one resistor or a plurality of resistors. One end of the current adjustment resistor 230 is connected to the output terminal of the operational amplifier 23, and the other end is connected to the inverting input terminal (−) of the operational amplifier 21.

The operational amplifier 24 serves as a fourth operational amplifier that generates an inverted voltage or a non-inverted voltage based on the AC excitation voltage Vex. The operational amplifier 24 outputs the generated voltage as an input signal for the operational amplifier 22.

In the first embodiment, the operational amplifier 24 constitutes the inverting amplification circuit 240. The inverting amplification circuit 240 includes, in addition to the operational amplifier 24, the gain adjustment resistor 241 and the gain adjustment variable resistor 242 for adjusting the gain of the inverting amplification circuit 240 itself.

The gain adjustment resistor 241 is composed of one or a plurality of fixed resistors, and the gain adjustment variable resistor 242 is a variable resistance element capable of adjusting the amplitude of the input signal for the operational amplifier 22 and is composed of at least one variable resistor.

In the inverting amplification circuit 240, one end of the gain adjustment resistor 241 is connected to the input terminal T1 of the excitation circuit 20. The ground potential G is connected to the non-inverting input terminal (+) of the operational amplifier 24, and the other end of the gain adjustment resistor 241 is connected to the inverting input terminal (−) of the operational amplifier 24. The gain adjustment variable resistor 242 is connected between the output terminal and the inverting input terminal (−) of the operational amplifier 24.

Accordingly, in the inverting amplification circuit 240, when the operational amplifier 24 receives the AC excitation voltage Vex from its own inverting input terminal (−), the operational amplifier 24 generates an inverted voltage in which the positive and negative polarities of the AC excitation voltage Vex are inverted. More specifically, the operational amplifier 24 generates an inverted voltage in which the amplitude of the AC excitation voltage Vex is amplified at a ratio obtained by dividing a resistance value of the gain adjustment variable resistor 242 by a resistance value of the gain adjustment resistor 241. The operational amplifier 24 outputs the generated inverted voltage to a current adjustment resistor 250.

The current adjustment resistor 250 is a resistance element for adjusting the magnitude of a current to be input to the inverting input terminal (−) of the operational amplifier 22. The current adjustment resistor 250 is composed of, for example, one resistor or a plurality of resistors. One end of the current adjustment resistor 250 is connected to the output terminal of the operational amplifier 24, and the other end is connected to the inverting input terminal (−) of the operational amplifier 22.

In the first embodiment, both the current adjustment resistor 230 and the current adjustment resistor 250 are composed of a fixed resistor. However, at least one of the current adjustment resistor 230 and the current adjustment resistor 250 may be composed of a variable resistor.

Next, the detector 30 constituting the current sensor 100 will be described with reference to FIG. 1.

The detector 30 serves as a detection circuit that detects the magnitude of the current flowing through the measurement object 2 based on the output signal of the operational amplifier 21 and the output signal of the operational amplifier 22.

The detector 30 of the first embodiment supplies the AC excitation voltage Vex to the input terminals T1 of the excitation circuit 20. In this state, the detector 30 generates a detection signal Vd indicating the magnitude of a measurement object current Iob flowing through the measurement object 2 based on an output voltage Vo1 output from an output terminal T2 of the excitation circuit 20 and an output voltage Vo2 output from an output terminal T3 of the excitation circuit 20.

The detector 30 includes a signal supplier 31, an adder 32, a filter 33, and a detector 34.

The signal supplier 31 generates the AC excitation voltage Vex having a predetermined frequency f. The signal supplier 31 according to the first embodiment generates the AC excitation voltage Vex having a sinusoidal wave or a triangular wave with a basic frequency f, and supplies the generated AC excitation voltage Vex to the input terminal T1 of the excitation circuit 20. That is, the signal supplier 31 serves as a supply circuit that supplies the AC excitation voltage Vex to the excitation circuit 20.

In addition, the signal supplier 31 generates a synchronized signal Vsy, which is a signal synchronized with the AC excitation voltage Vex and has a frequency twice the predetermined frequency f, and supplies the generated synchronized signal Vsy to the detector 34.

The adder 32 adds the voltage Vo1 as an output signal of the operational amplifier 21 and the voltage Vo2 as an output signal of the operational amplifier 22. As a result, the adder 32 generates an added signal Vadd indicating a difference between an induced voltage V1 generated in the excitation coil 121 and an induced voltage V2 generated in the excitation coil 122.

The added signal Vadd indicates a voltage value (V1−V2) obtained by adding a sum voltage (Vex+V1) of the AC excitation voltage Vex and the induced voltage V1 and a sum voltage {−(Vex+V2)} of the AC excitation voltage Vex and the induced voltage V2.

In a state in which the measurement object current Iob flows through the measurement object 2, a magnetic flux $\phi0$ caused by a magnetic field formed around the measurement object 2 is generated in the same direction in both the excitation coil 121 and the excitation coil 122. The magnetic fluxes generated in both the excitation coil 121 and the excitation coil 122 change due to the influence of the magnetic flux φ0.

For example, when the above-described magnetic flux φ0, an AC magnetic flux φ1, and an AC magnetic flux φ2 are generated in the directions illustrated in FIG. 1, the directions of the AC magnetic flux φ1 and the magnetic flux φ0 are opposite to each other in the magnetic core 111, and a total combined magnetic flux da generated inside can be expressed by the following equation.

$$\Phi a = \Phi 1 - \Phi 0$$

On the other hand, in the magnetic core 112, the directions of the AC magnetic flux φ2 and the magnetic flux φ0 are the same, and a total combined magnetic flux Ob generated inside can be expressed by the following equation with the direction of the AC magnetic flux φ1 as a reference.

$$\Phi b = -(\Phi 2 + \Phi 0)$$

Accordingly, as both the combined magnetic flux Da in the magnetic core 111 and the combined magnetic flux Øb in the magnetic core 112 change, the amplitude of the induced voltage V1 generated in the excitation coil 121 and the amplitude of the induced voltage V2 generated in the excitation coil 122 also change. Thus, the added signal Vadd (=V1–V2) indicating a differential voltage between the induced voltage V1 and the induced voltage V2 is an amplitude-modulated signal in which a signal component of a detection frequency 2f obtained by doubling the frequency f of the AC excitation voltage Vex is modulated by the amplitude of the measurement object current Iob.

The filter 33 is composed of, for example, a bandpass filter whose passband is defined as a narrow band including the detection frequency 2f. The filter 33 according to the first embodiment selectively allow a signal component of the detection frequency 2f contained in the added signal Vadd from the adder 32 to pass through. As a result, an extracted signal Vf indicating the magnitude of the differential voltage between the induced voltage V1 and the induced voltage V2 is output.

The extracted signal Vf is mainly composed of a signal component of the detection frequency 2f because noise components contained in the added signal Vadd, which are frequency components other than the detection frequency 2f due to an external noise, are removed. When this kind of noise components is extremely small and the influence of the noise components on the added signal Vadd can be ignored, the filter 33 may be omitted.

The detector 34 synchronously detects the extracted signal Vf output from the filter 33 with the synchronized signal Vsy output from the signal supplier 31. As a result, the detection signal Vd whose voltage value changes in proportion to the current value of the measurement object current Iob flowing through the measurement object 2 is output.

The above configuration has been described for the current sensor 100. Next, the measurement section 200 constituting the measuring device 1 will be described.

The measurement section 200 measures a physical quantity of the measurement object 2 based on the detection signal Vd detected by the current sensor 100. The measurement section 200 is composed of, for example, an oscilloscope, a spectrum analyzer, or the like.

In the first embodiment, the measurement section 200 calculates a current value of the measurement object current Iob flowing through the measurement object 2 based on the voltage value of the detection signal Vd. The measurement section 200 includes, for example, a processor 40 and an output device 50.

The processor 40 is composed of, for example, a computer including an A/D converter, a processor, and a memory. Examples of the processor include a central processing unit (CPU) and a micro processor unit (MPU).

The processor 40 according to the first embodiment converts instantaneous values of the detection signal Vd output from the detector 34 into waveform data indicating the instantaneous values in chronological order. Then, the processor 40 calculates current waveform data indicating the waveform of the measurement object current Iob based on the converted waveform data and stores the current waveform data in the memory.

The processor 40 calculates a current value, for example, an amplitude, an average value, or an effective value of the measurement object current Iob based on the current waveform data stored in the memory, and stores the current value in the memory. In this way, the processor 40 measures the current value of the measurement object current Iob. Further, the processor 40 outputs result information indicating the current value or the current waveform data of the measurement object current Iob to the output device 50.

The output device 50 is composed of, for example, a display device such as an LCD. The output device 50 displays the current value or the waveform of the measurement object current Iob on a display screen based on the result information output from the processor 40.

The output device 50 may be composed of various interface circuits instead of the display device described above. For example, the output device 50 may be configured to store the result information in a removable medium as a media interface circuit or transmit the result information to an external device via a network as a network interface circuit.

Next, an operation of the measuring device 1 according to the first embodiment will be described. Here, as illustrated in FIG. 1, it is assumed that the measurement object 2 through which the measurement object current Iob flows is inserted into each of the pair of magnetic cores 11.

In the current sensor 100, as described above, the signal supplier 31 outputs the AC excitation voltage Vex having the frequency f to the non-inverting input terminal (+) of the operational amplifier 23 constituting the voltage follower circuit 220 via the phase adjustment circuit 210.

At the same time, the signal supplier 31 outputs the AC excitation voltage Vex to the inverting input terminal (−) of the operational amplifier 24 constituting the inverting amplification circuit 240. Further, the signal supplier 31 outputs the synchronized signal Vsy having the detection frequency 2f to the detector 34.

At this time, in the phase adjustment circuit 210, the phase angle of the AC excitation voltage Vex is adjusted such that a phase difference between the excitation current I1 supplied to the excitation coil 121 and the excitation current I2 supplied to the excitation coil 122 is a reference value of 180 degrees. This phase angle is defined in advance, for example, through experiment or testing.

Further, in the inverting amplification circuit 240, the resistance value of the gain adjustment variable resistor 242 is adjusted such that an amplitude difference between the excitation current I1 and the excitation current I2 is zero. This resistance value is defined in advance, for example, through experiment or testing.

In such a state, the operational amplifier 23 outputs the non-inverted voltage of the AC excitation voltage Vex whose phase angle has been adjusted by the phase adjustment circuit 210 to the inverting input terminal (–) of the operational amplifier 21 via the current adjustment resistor 230. At the same time, the operational amplifier 24 outputs the inverted voltage of the AC excitation voltage Vex output from the signal supplier 31 to the inverting input terminal (–) of the operational amplifier 22 via the current adjustment resistor 250.

The operational amplifier 21 performs negative feedback operation to change the output voltage Vo1 in response to the non-inverted voltage from the operational amplifier 23. As a result, the operational amplifier 21 supplies the excitation current I1 having a current value corresponding to the voltage value of the AC excitation voltage Vex to the excitation coil 121.

At the same time, the operational amplifier 22 performs negative feedback operation to change the output voltage Vo2 in response to the inverted voltage from the operational amplifier 23. As a result, the operational amplifier 22 supplies the excitation current I2 having a current value corresponding to the voltage value of the AC excitation voltage Vex to the excitation coil 122 such that the direction of the AC magnetic flux φ2 generated in the magnetic core 112 is opposite to the direction of the AC magnetic flux φ1 generated in the magnetic core 111.

At this time, the frequencies of both the excitation current I1 and the excitation current I2 are equal to the frequency f of the AC excitation voltage Vex. In addition, as described above, the phase angle of the AC excitation voltage Vex to be input to the operational amplifier 23 is adjusted by the phase adjustment circuit 210 such that a phase difference between these excitation currents is the reference value of 180 degrees according to the first embodiment.

In addition, the amplitude of the inverted voltage to be output from the operational amplifier 24 is adjusted by the gain adjustment variable resistor 242 of the inverting amplification circuit 240 such that an amplitude difference between the excitation current I1 and the excitation current I2 is eliminated.

Accordingly, the amplitudes of the excitation current I1 and the excitation current I2 are substantially the same as each other and the phases thereof are inverted by 180 degrees to each other. In a state in which the excitation current I1 and the excitation current I2 are supplied to the excitation coil 121 and the excitation coil 122, as described above, the magnetic flux φ0 is generated in the same direction in each of the magnetic cores 111, 112 due to the measurement object current Iob of the measurement object 2.

The combined magnetic flux a and the combined magnetic flux Øb generated in the magnetic core 111 and the magnetic core 112 change due to the influence of the magnetic flux φ0 described above, whereby the amplitudes of the induced voltage V1 and the induced voltage V2 generated at both ends of the excitation coil 121 and the excitation coil 122 also change, respectively.

Then, the adder 32 adds the output voltage Vo1 (=Vex+ V1) including the induced voltage V1 and the output voltage Vo2 (=–(Vex+V2)) including the induced voltage V2 to each other. As a result, the added signal Vadd (=V1–V2), which indicates a differential voltage between the induced voltage V1 and the induced voltage V2 and is composed of a signal component of the detection frequency 2f, is generated.

Subsequently, the filter 33 outputs the extracted signal Vf obtained by removing noise components contained in the added signal Vadd to the detector 34. The detector 34 synchronously detects the extracted signal Vf with the synchronized signal Vsy, thereby outputting the detection signal Vd whose voltage value changes in proportion to the current value of the measurement object current Iob flowing through the measurement object 2.

In the measuring device 1, the detection signal Vd output from the current sensor 100 in this way is input to the processor 40. Then, the processor 40 converts the detection signal Vd into waveform data indicating instantaneous values thereof, calculates current waveform data of the measurement object current Iob based on the converted waveform data, and stores the current waveform data in the memory.

Further, the processor 40 calculates a current value of the measurement object current Iob based on the current waveform data stored in the memory, and stores the current value in the memory. At the same time, the processor 40 outputs measurement result information indicating the calculated current value and waveform of the measurement object current Iob to the output device 50.

The output device 50 composed of a display device displays the measurement result information output from the processor 40 on a display screen. This is the end of the measurement of the measurement object current Iob by the measuring device 1 including the current sensor 100.

Next, the excitation current I1 and the excitation current I2 generated by the excitation circuit 20 of the first embodiment will be described.

FIG. 3 is a time chart for explaining a phase difference between the excitation current I1 and the excitation current I2 in the first embodiment. Here, a result obtained by creating a model of the excitation circuit 20 and performing a simulation under ideal conditions is illustrated.

In FIG. 3, a combined signal (I1+I2) obtained by adding the excitation current I1 and the excitation current I2 generated by the excitation circuit 20 of the first embodiment is indicated by a solid line. In addition, as a comparative object, a combined signal obtained by adding currents supplied to respective excitation coils in a circuit configuration disclosed in JP 2018-179689 A is indicated by a broken line.

The amplitude of the combined signal (I1+I2) increases as the phase difference between the excitation current I1 and the excitation current I2 deviates from the reference value of 180 degrees. Here, the reference value of 180 degrees is a phase difference between the excitation current I1 and the excitation current I2 in an ideal state in which the AC magnetic flux φ1 and the AC magnetic flux φ2 are completely canceled by each other. The reference value is 180 degrees because the excitation coil 121 is wound in the same direction as the excitation coil 122, but is 0 degrees when the excitation coil 121 is wound in the opposite direction to the excitation coil 122.

As illustrated in FIG. 3, the amplitude of the combined signal (I1+I2) in the first embodiment is reduced as compared with the amplitude in the circuit configuration of the comparative object by the phase adjustment circuit 210 disposed at a stage preceding the voltage follower circuit 220 illustrated in FIG. 2. In this way, by disposing the phase adjustment circuit 210 in the excitation circuit 20, the phase difference between the excitation current I1 and the excitation current I2 can be made close to 180 degrees. Accordingly, excitation noises can be reduced.

Next, the operation and effects of the first embodiment will be described.

In the first embodiment, the excitation circuit 20 excites the pair of flux gates 10 for detecting a physical quantity of the measurement object 2. The excitation circuit 20 includes the operational amplifier 21 (first operational amplifier), the operational amplifier 22 (second operational amplifier), and the signal generation circuit 201.

The operational amplifier 21 supplies the excitation current I1, which is the first excitation current, to the excitation coil 121 (first coil) constituting the flux gate 101 (first flux gate). The operational amplifier 22 supplies the excitation current I2, which is the second excitation current, to the excitation coil 122 (second coil) constituting the flux gate 102 (second flux gate). By disposing the pair of flux gates 10 in the feedback paths of the pair of operational amplifiers 21, 22 in this manner, highly-responsive detection can be realized.

The signal generation circuit 201 generates an input signal for the operational amplifier 21 and an input signal for the operational amplifier 22. The signal generation circuit 201 includes the operational amplifier 23 (third operational amplifier) and the operational amplifier 24 (fourth operational amplifier).

Based on the AC excitation voltage Vex for exciting the pair of flux gates, the operational amplifier 23 generates an inverted voltage or a non-inverted voltage of the AC excitation voltage Vex as an input signal for the operational amplifier 21. Based on the AC excitation voltage Vex, the operational amplifier 24 generates an inverted voltage or a non-inverted voltage of the AC excitation voltage Vex as an input signal for the operational amplifier 22.

According to this configuration, the pair of excitation circuits 301, 302, which are a pair of circuits for exciting the pair of flux gates 101, 102, and are composed of the excitation circuit 301 including the operational amplifiers 21, 23 and the excitation circuit 302 including the operational amplifier 22, 24, operate independently of each other.

That is, the pair of excitation circuits 301, 302 are configured such that each of the excitation circuits does not wait for the output of the other excitation circuit or each of the excitation circuits does not perform negative feedback using an output signal of the other excitation circuit. As a result, in each excitation circuit, signal delay due to the influence of the other excitation circuit is suppressed, and thus the deviation of the phase difference between the excitation current I1 and the excitation current I2 from the reference value is suppressed.

Further, according to the above-described configuration, the operational amplifiers 21, 23, 22, 24 of the pair of excitation circuits 301, 302 are mutually symmetrically configured. Specifically, the operational amplifiers 21, 23 constituting the excitation circuit 301 and the operational amplifiers 22, 24 constituting the excitation circuit 302 are symmetrically configured.

In other words, both the excitation circuits 301, 302 are the same as each other in the number of operational amplifiers and only differ in inverting amplification or non-inverting amplification, fixed resistor or variable resistor, or presence or absence of a phase adjustment circuit. For this reason, in both excitation circuits 300, 301, the operational amplifiers that affect the delay of the excitation current perform operation similar to each other, that is, substantially the same operation, and thus the deviation of the phase difference between the excitation current I1 and the excitation current I2 from the reference value is suppressed. Thus, a difference between the AC magnetic flux φ1 and the AC magnetic flux φ2 that occurs in the pair of flux gates 10 due to the AC excitation voltage Vex can be suppressed.

Accordingly, it is possible to suppress excitation noises caused by the difference between the AC magnetic flux φ1 and the AC magnetic flux φ2 that occurs in the pair of flux gates 10 from being superimposed on a signal component of the measurement object 2.

The signal generation circuit 201 according to the first embodiment further includes the phase adjustment circuit 210 capable of adjusting the phase of an input signal for the operational amplifier 21. Then, the operational amplifier 23 generates a non-inverted voltage of the AC excitation voltage Vex based on the AC excitation voltage Vex, and the operational amplifier 24 generates an inverted voltage of the AC excitation voltage Vex based on the AC excitation voltage Vex.

According to this configuration, by combining the operational amplifier 23 generating a non-inverted voltage and the phase adjustment circuit 210, it is possible to make the phase difference between the excitation current I1 and the excitation current I2 close to the reference value of 180 degrees while simplifying the configuration of the signal generation circuit 201. In addition, since the above-described configuration is simpler than the configuration in which the operational amplifier 24 generating an inverted voltage and the phase adjustment circuit 210 are combined, it is possible to reduce a workload of making the phase difference between the excitation current I1 and the excitation current I2 close to the reference value.

The phase adjustment circuit 210 according to the first embodiment is connected between the signal supplier 31 serving as a circuit for outputting the AC excitation voltage Vex and the non-inverting input terminal (+) of the operational amplifier 23.

According to this configuration, the phase adjustment circuit 210 is not affected by the current flowing between the operational amplifier 23 and the operational amplifier 21 as compared with the case where the phase adjustment circuit is connected between the operational amplifier 23 and the operational amplifier 21. Thus, noises associated with the employment of the phase adjustment circuit 210 can be reduced. Further, an operation of adjusting the phase difference between the excitation current I1 and the excitation current I2 to be close to the reference value can be easily performed.

In the first embodiment, the gain adjustment variable resistor 242 is connected between the inverting input terminal (−) and the output terminal of the operational amplifier 24 generating an inverted voltage of the AC excitation voltage Vex, as a variable resistor capable of adjusting the amplitude of an input voltage for the operational amplifier 22.

According to this configuration, by using the gain adjustment variable resistor 242, it is possible to reduce the amplitude difference between the excitation current I1 and the excitation current I2 due to the arrangement of the signal generation circuit 201.

In addition, since the excitation circuit 20 has a circuit configuration in which the phase difference between the excitation current I1 and the excitation current I2 is adjusted to be close to the reference value in generating the excitation current I1 and the amplitudes of the excitation current I1 and the excitation current I2 are adjusted to be close to each other in generating the excitation current I2, the phase difference and the amplitudes can be independently adjusted. As a result, compared to a configuration in which the phase difference and the amplitude difference between the excitation current I1 and the excitation current I2 are collectively adjusted to be reduced in generating one of the excitation current I1 and the excitation current I2, it is possible to reduce a workload while reducing a work time required for such adjustment.

The pair of flux gates 10 according to the first embodiment are disposed along the circumferential direction of the measurement object 2, and the excitation coil 121 is wound in the same direction as the excitation coil 122. As described above, the operational amplifier 23 supplies a non-inverted voltage of the AC excitation voltage Vex to the non-inverting input terminal (−) of the operational amplifier 21, and the operational amplifier 24 supplies an inverted voltage of the AC excitation voltage Vex to the non-inverting input terminal (−) of the operational amplifier 22.

According to this configuration, it is possible to use the adder 32 that adds an output signal of the operational amplifier 21 and an output signal of the operational amplifier 22 in order to generate the detection signal Vd indicating the measurement object current Iob of the measurement object 2 in the detector 30 of the current sensor 100.

The circuit configuration of the adder 32 is simpler than that of a subtraction circuit that calculates a difference between the output voltage Vo1 output of the operational amplifier 21 and the output voltage Vo2 of the operational amplifier 22. Thus, the circuit configuration of the detector 30 of the current sensor 100 can be simplified.

The current sensor 100 according to the first embodiment includes the excitation circuit 20 described above and the detector 30 as a detection circuit that detects the magnitude of the measurement object current Iob flowing through the measurement object 2 based on the output voltage Vo1 of the operational amplifier 21 and the output voltage Vo2 of the operational amplifier 22.

For example, the detector 30 synchronously detects the added signal Vadd of the output voltage Vo1 of the operational amplifier 21 and the output voltage Vo2 of the operational amplifier 22 with the synchronized signal Vsy having the detection frequency 2f which is twice the frequency f of the AC excitation voltage Vex. As a result, the detection signal Vd indicating the magnitude of the measurement object current Iob can be acquired.

According to this configuration, since a phase difference between the excitation current I1 and the excitation current I2 can be made close to the reference value by the excitation circuit 20, it is possible to reduce excitation noises caused by the deviation of the phase difference from the reference value in the detection signal Vd.

In addition, the measuring device 1 according to the first embodiment includes the current sensor 100 described above and the measurement section 200 that measures a physical quantity of the measurement object 2 based on the detection signal Vd detected by the current sensor 100.

According to this configuration, since excitation noises superimposed on the detection signal Vd is smaller than that of the comparative object indicated by the broken line in FIG. 3, it is possible to improve the accuracy of measurement of the physical quantity of the measurement object 2.

Next, other embodiments will be described. In the following, the same components as those in the first embodiment will be denoted by the same reference signs and duplicate descriptions will be omitted.

Second Embodiment

FIG. 4 is a circuit diagram illustrating a circuit configuration of an excitation circuit 20A according to a second embodiment. The excitation circuit 20A corresponds to the excitation circuit 20 illustrated in FIG. 2, and is provided in the current sensor 100 of the measuring device 1 instead of the excitation circuit 20. The excitation circuit 20A includes a pair of excitation circuits 301A, 302A corresponding to the pair of excitation circuits 301, 302 illustrated in FIG. 2.

The excitation circuit 20A of the second embodiment differs from the excitation circuit 20 of the first embodiment in the connection configuration of the operational amplifier 21 and the operational amplifier 22. Accordingly, the excitation circuit 20A includes one current adjustment resistor 260 instead of the current adjustment resistor 230 and the current adjustment resistor 250 constituting the excitation circuit 20 illustrated in FIG. 2. Other components are the same as those of the excitation circuit 20 illustrated in FIG. 2.

In the excitation circuit 20A, the output terminal of the operational amplifier 23 is connected to the non-inverting input terminal (+) of the operational amplifier 21, and the output terminal of the operational amplifier 24 is connected to the non-inverting input terminal (+) of the operational amplifier 22. Further, the current adjustment resistor 260 is connected between the inverting input terminal (−) of the operational amplifier 21 and the inverting input terminal (−) of the operational amplifier 22.

The current adjustment resistor 260 is a resistance element for adjusting the amplitudes of the excitation current I1 and the excitation current I2 flowing through the pair of excitation coils 12, respectively. The current adjustment resistor 260 is composed of one resistor or a plurality of resistors.

By employing the connection configuration of the operational amplifier 21 and the operational amplifier 22 as in the second embodiment, both the excitation current I1 and the excitation current I2 can be set to the same current value only by using one current adjustment resistor 260.

Thus, the configuration of the excitation circuit 20A can be simplified as compared with the excitation circuit 20 of the first embodiment. Further, the current values of both the excitation current I1 and the excitation current I2 can be adjusted while being maintained at the same value only by changing the resistance value of one current adjustment resistor 260.

For example, in the excitation circuit 20 of the first embodiment, even when resistance elements of the same type are used as the current adjustment resistor 230 and the current adjustment resistor 250, an amplitude difference between the excitation current I1 and the excitation current I2 may occur due to variations in the respective resistance elements. On the other hand, in the second embodiment, since the current values of both the excitation current I1 and the excitation current I2 are the same value, the current values of the both can be adjusted without generating amplitude differences.

Subsequently, operation and effects of the second embodiment will be described.

As in the first embodiment, the excitation circuit 20A according to the second embodiment includes the operational amplifier 21, the operational amplifier 22, and the signal generation circuit 201. The signal generation circuit 201 includes the operational amplifier 23 and the operational amplifier 24. Thus, similar to the first embodiment, a difference between the magnetic fluxes generated in the pair of flux gates 10 by the AC excitation voltage Vex can be suppressed.

Further, in the second embodiment, impedance to the output terminals of the operational amplifier 23 and the operational amplifier 24 is higher than that in the first embodiment, and thus power consumption can be reduced.

As in the first embodiment, the signal generation circuit 201 according to the second embodiment further includes the phase adjustment circuit 210 capable of adjusting the phase of an input signal for the operational amplifier 21. Then, the operational amplifier 23 generates a non-inverted voltage of the AC excitation voltage Vex based on the AC excitation voltage Vex, and the operational amplifier 24 generates an inverted voltage of the AC excitation voltage Vex based on the AC excitation voltage Vex.

Further, the pair of flux gates 10 are disposed along the circumferential direction of the measurement object 2, and the excitation coil 121 is wound in the same direction as the excitation coil 122. The non-inverting input terminal (+) of the operational amplifier 21 is connected to the output terminal of the operational amplifier 23, and the non-inverting input terminal (+) of the operational amplifier 22 is connected to the output terminal of the operational amplifier 24. The inverting input terminals (−) of the operational amplifier 21 and the operational amplifier 22 are connected to each other via the current adjustment resistor 260 constituting a resistance element.

According to this configuration, as compared with the excitation circuit 20 of the first embodiment, the circuit configuration of the excitation circuit 20A can be simplified, and the excitation current I1 and the excitation current I2 can be easily adjusted while being maintained at the same value by changing the resistance value of the current adjustment resistor 260.

Third Embodiment

FIG. 5 is a diagram illustrating a configuration of a measuring device 1B according to a third embodiment.

The measuring device 1B is different from the first embodiment and the second embodiment in that the winding directions of a pair of excitation coils 12B are different from each other and the configurations of circuits connected to the pair of excitation coils 12B are the same as each other.

The measuring device 1B includes a current sensor 100B instead of the current sensor 100 of the measuring device 1 in the first embodiment. The current sensor 100B includes an excitation circuit 20B instead of the excitation circuit 20 or 20A illustrated in FIG. 2 or 4, and includes a subtracter 32B instead of the adder 32 of the detector 30 illustrated in FIG. 1.

The current sensor 100B includes a pair of flux gates 10B instead of the pair of flux gates 10 illustrated in FIG. 1. The pair of flux gates 10B includes the pair of magnetic cores 11 illustrated in FIG. 1 and the pair of excitation coils 12B whose winding directions are different from each other.

The pair of excitation coils 12B is composed of the excitation coil 121 illustrated in FIG. 1 and an excitation coil 123 whose number of turns is the same as and whose winding direction is opposite to the excitation coil 121.

The excitation circuit 20B includes an inverting amplification circuit 220B instead of the phase adjustment circuit 210 and the voltage follower circuit 220 in the first embodiment. The other components are the same as those illustrated in FIG. 2. The excitation circuit 20B includes a pair of excitation circuits 301B, 302B corresponding to the pair of excitation circuits 301, 302 illustrated in FIG. 2.

The inverting amplification circuit 220B has a circuit configuration similar to that of the inverting amplification circuit 240, and includes an operational amplifier 23B corresponding to the operational amplifier 23 illustrated in FIG.

2, a gain adjustment resistor 221, and a gain adjustment resistor 222. That is, the inverting amplification circuit 220B constitutes a first amplification circuit including the operational amplifier 23B, and the inverting amplification circuit 240 constitutes a second amplification circuit including the operational amplifier 24. The inverting amplification circuit 220B and the inverting amplification circuit 240 have the same circuit configuration.

One end of the gain adjustment resistor 221 is connected to an input terminal T1 of the inverting amplification circuit 220B. The ground potential G is connected to the non-inverting input terminal (+) of the operational amplifier 23B, and the other end of the gain adjustment resistor 221 is connected to the inverting input terminal (−) of the operational amplifier 23B. The gain adjustment resistor 222 is connected between the output terminal and the inverting input terminal (−) of the operational amplifier 23B.

In this way, the excitation circuit 20B has a configuration in which the first excitation circuit including the operational amplifier 21, the inverting amplification circuit 220B, and the current adjustment resistor 230 is symmetrical to the second excitation circuit including the operational amplifier 22, the inverting amplification circuit 240, and the current adjustment resistor 250.

Thus, even when the phase adjustment circuit 210 is not disposed, it is possible to suppress the deviation, from the reference value, of the phase difference between the excitation current I1 and the excitation current I2 respectively supplied to the pair of excitation coils 12B. Accordingly, it is possible to suppress the deviation of the phase difference between the excitation current I1 and the excitation current I2 from the reference value while reducing the manufacturing cost and the size of the excitation circuit 20B.

The subtracter 32B according to the third embodiment calculates a difference between the output voltage Vo1 of the operational amplifier 21 and the output voltage Vo2 of the operational amplifier 22. The output voltage Vo1 is a sum of the AC excitation voltage Vex and the induced voltage V1 (Vex+V1), and the output voltage Vo2 is a difference between the AC excitation voltage Vex and the induced voltage V2 (Vex−V2).

Thus, a subtracted signal Vsub indicating the difference between the output voltage Vo1 and the output voltage Vo2 can be expressed by the following equation.

$$Vsub = Vex + V1 - (Vex - V2) = V1 - V2$$

In this way, the subtracted signal Vsub indicates a differential voltage between the induced voltage V1 and the induced voltage V2, similarly to the added signal Vadd in the first embodiment and the second embodiment. The subtracter 32B outputs the calculated subtracted signal Vsub to the detector 34 via the filter 33.

As in the first embodiment and the second embodiment, the detector 34 synchronously detects the extracted signal Vf output from the filter 33 with the synchronized signal Vsy output from the signal supplier 31. As a result, the detection signal Vd whose voltage value changes in proportion to the current value of the measurement object current Iob flowing through the measurement object 2 is output.

FIG. 6 is a time chart for explaining deviation of a phase difference between the excitation current I1 and the excitation current I2 from the reference value in the third embodiment. Here, a result obtained by creating a model of the excitation circuit 20B illustrated in FIG. 5 and performing a simulation under ideal conditions is illustrated.

In FIG. 6, a combined signal (I1–I2) indicating a difference between the excitation current I1 and the excitation current I2 generated by the excitation circuit 20B of the third embodiment is indicated by a solid line. In addition, as a comparative object, a combined signal indicating a difference between the excitation current I1 and the excitation current I2 generated by the excitation circuit 20 of the first embodiment is indicated by a broken line. The amplitude of the combined signal increases as the phase difference between the excitation current I1 and the excitation current I2 deviates from a reference value of 0 degrees.

As illustrated in FIG. 5, in the excitation circuit 20B, the first excitation circuit that generates the excitation current I1 and the second excitation circuit that generates the excitation current I2 have the same circuit configuration. Thus, the amplitude of the combined signal (I1–I2) is smaller than that of the excitation circuit 20 in the first embodiment as illustrated in FIG. 6.

In this way, by configuring two systems in the excitation circuit 20B in a symmetric manner, the phase difference between the excitation current I1 and the excitation current I2 can be made close to 0 degrees. Accordingly, excitation noises can be reduced.

Subsequently, operation and effects of the third embodiment will be described.

In the third embodiment, the pair of flux gates 10B are disposed along the circumferential direction of the measurement object 2, and the excitation coil 121 is wound in an opposite direction to the excitation coil 123. The inverting input terminal (−) of the operational amplifier 21 is connected to the output terminal of the operational amplifier 23B (third operational amplifier) via the current adjustment resistor 230 (first resistance element), and the non-inverting input terminal (+) of the operational amplifier 21 is connected to the ground potential G.

Further, the inverting input terminal (−) of the operational amplifier 22 is connected to the output terminal of the operational amplifier 24 via the current adjustment resistor 250 (second resistance element), and the non-inverting input terminal (+) of the operational amplifier 22 is connected to the ground potential G. The ground potential G is a reference potential of the current sensor 100.

According to this configuration, since the connection configuration of the operational amplifier 21 and the operational amplifier 23B and the connection configuration of the operational amplifier 22 and the operational amplifier 24B can be symmetrical to each other, it is possible to suppress the deviation of the phase difference between the excitation current I1 and the excitation current I2 from the reference value. Thus, a difference between the AC magnetic flux $\phi 1$ and the AC magnetic flux $\phi 2$ that occurs in the pair of flux gates 10B due to the AC excitation voltage Vex can be suppressed.

In addition, the current supplied to the respective inverting input terminals (−) of the operational amplifier 21 and the operational amplifier 22 can be reduced by disposing the operational amplifier 23B and the operational amplifier 24 in the signal generation circuit 201. Thus, heat generation and power loss in the current adjustment resistor 230 and the current adjustment resistor 250 can be reduced.

In the third embodiment, the inverting amplification circuit 220B (first amplification circuit) including the operational amplifier 23B and the inverting amplification circuit 240 (second amplification circuit) including the operational amplifier 24 have the same circuit configuration. Thus, compared with the first embodiment and the second embodiment, it is possible to suppress the deviation of the phase difference between the excitation current I1 and the excitation current I2 from the reference value.

Figure 8:
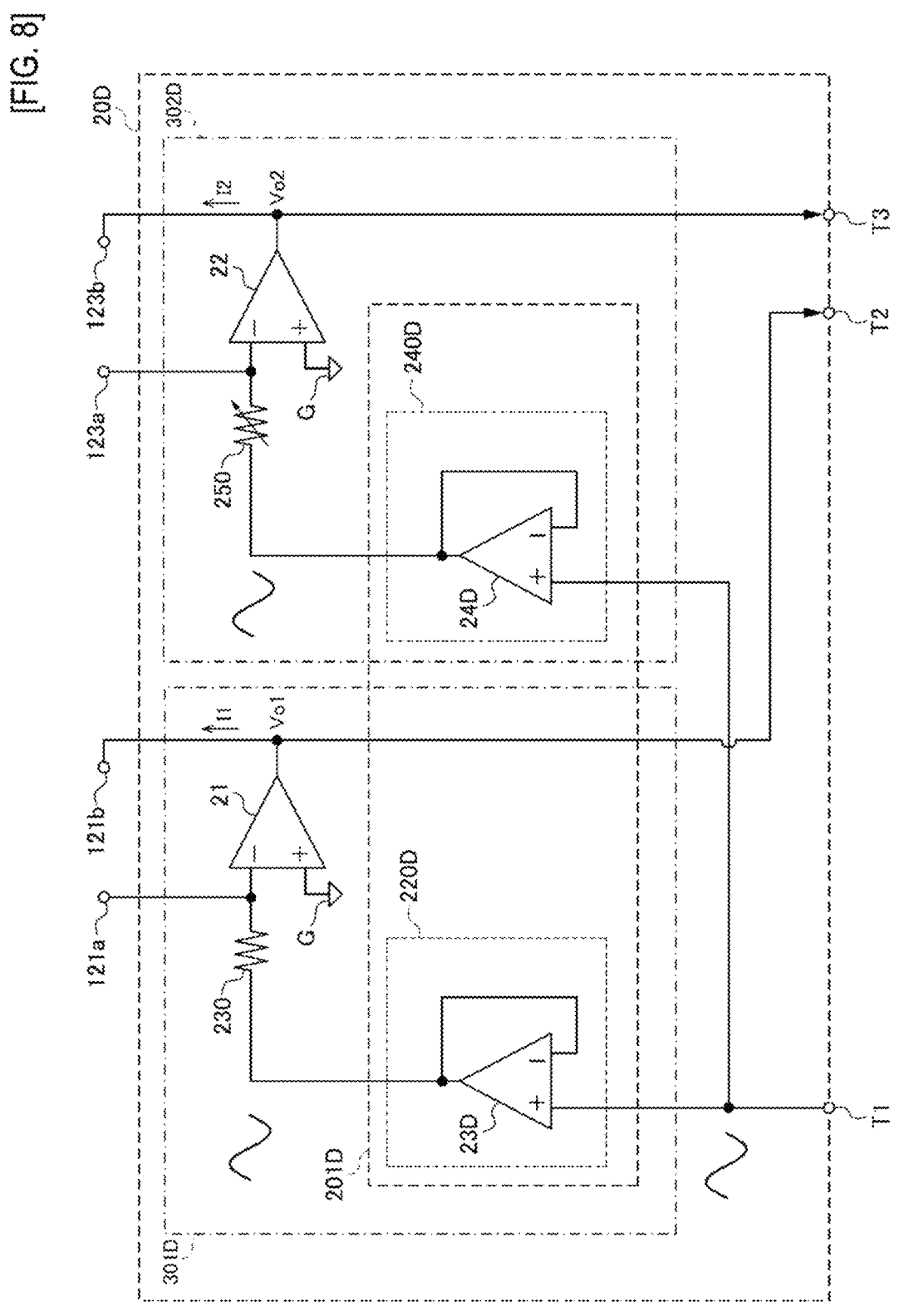

Next, a modification example of the excitation circuit 20B according to the third embodiment will be described with reference to FIG. 7 and FIG. 8.

FIG. 7 is a circuit diagram illustrating a configuration of an excitation circuit 20C according to a first modification example. The excitation circuit 20C corresponds to the excitation circuit 20B illustrated in FIG. 5, and includes a pair of excitation circuits 301C, 302C corresponding to the pair of excitation circuits 301B, 302B.

The excitation circuit 20C according to the first modification example includes a non-inverting amplification circuit 220C and a non-inverting amplification circuit 240C instead of the inverting amplification circuit 220B and the inverting amplification circuit 240.

The non-inverting amplification circuit 220C includes an operational amplifier 23C, a gain adjustment resistor 223, and a gain adjustment resistor 224. The non-inverting amplification circuit 240C includes an operational amplifier 24C, a gain adjustment resistor 243, and a gain adjustment variable resistor 244.

In the present modification example, the non-inverting amplification circuit 220C constitutes a first amplification circuit including the operational amplifier 23C, and the non-inverting amplification circuit 240C constitutes a second amplification circuit including the operational amplifier 24C. As in the third embodiment, the non-inverting amplification circuit 220C and the non-inverting amplification circuit 240C have the same circuit configuration.

In the non-inverting amplification circuit 220C, an input terminal T1 of the excitation circuit 20C is connected to the non-inverting input terminal (+) of the operational amplifier 23C, and the gain adjustment resistor 223 is connected between the inverting input terminal (−) and the output terminal of the operational amplifier 23C. Further, the gain adjustment resistor 224 is connected between the inverting input terminal (−) of the operational amplifier 23C and the ground potential G.

In the non-inverting amplification circuit 240C, the input terminal T1 of the excitation circuit 20C is connected to the non-inverting input terminal (+) of the operational amplifier 24C, and the gain adjustment resistor 243 is connected between the inverting input terminal (−) and the output terminal of the operational amplifier 24C. Further, the gain adjustment variable resistor 244 is connected between the inverting input terminal (−) of the operational amplifier 24C and the ground potential G.

In this way, even with the excitation circuit 20C including the non-inverting amplification circuit 220C and the non-inverting amplification circuit 240C, it is possible to suppress a difference between the AC magnetic flux $\phi 1$ and the AC magnetic flux $\phi 2$ as in the excitation circuit 20B illustrated in FIG. 5.

FIG. 8 is a circuit diagram illustrating a configuration of an excitation circuit 20D according to a second modification example. The excitation circuit 20D corresponds to the excitation circuit 20B illustrated in FIG. 5, and includes a pair of excitation circuits 301D, 302D corresponding to the pair of excitation circuits 301B, 302B.

The excitation circuit 20D according to the second modification example includes a voltage follower circuit 220D and a voltage follower circuit 240D instead of the inverting amplification circuit 220B and the inverting amplification circuit 240.

The voltage follower circuit 220D and the voltage follower circuit 240D include an operational amplifier 23D corresponding to the operational amplifier 23 illustrated in FIG. 2 and an operational amplifier 24D corresponding to the operational amplifier 24 illustrated in FIG. 2, respectively.

In the present modification example, the voltage follower circuit 220D constitutes a first amplification circuit including the operational amplifier 23D, and the voltage follower circuit 240D constitutes a second amplification circuit including the operational amplifier 24D. The voltage follower circuit 220D and the voltage follower circuit 240D have the same circuit configuration.

In the voltage follower circuit 220D, an input terminal T1 of the excitation circuit 20D is connected to the non-inverting input terminal (+) of the operational amplifier 23D, and the inverting input terminal (−) and the output terminal of the operational amplifier 23D are connected to each other.

In the voltage follower circuit 240D, the input terminal T1 of the excitation circuit 20D is connected to the non-inverting input terminal (+) of the operational amplifier 24D, and the inverting input terminal (−) and the output terminal of the operational amplifier 24D are connected to each other.

Fourth Embodiment

Next, the signal supplier 31 constituting the measuring device 1 according to a fourth embodiment will be described with reference to FIG. 9A and FIG. 9B. Since other components are the same as those in the first embodiment or the second embodiment, they will be denoted by the same reference signs and redundant descriptions will be omitted.

Figure 9A:
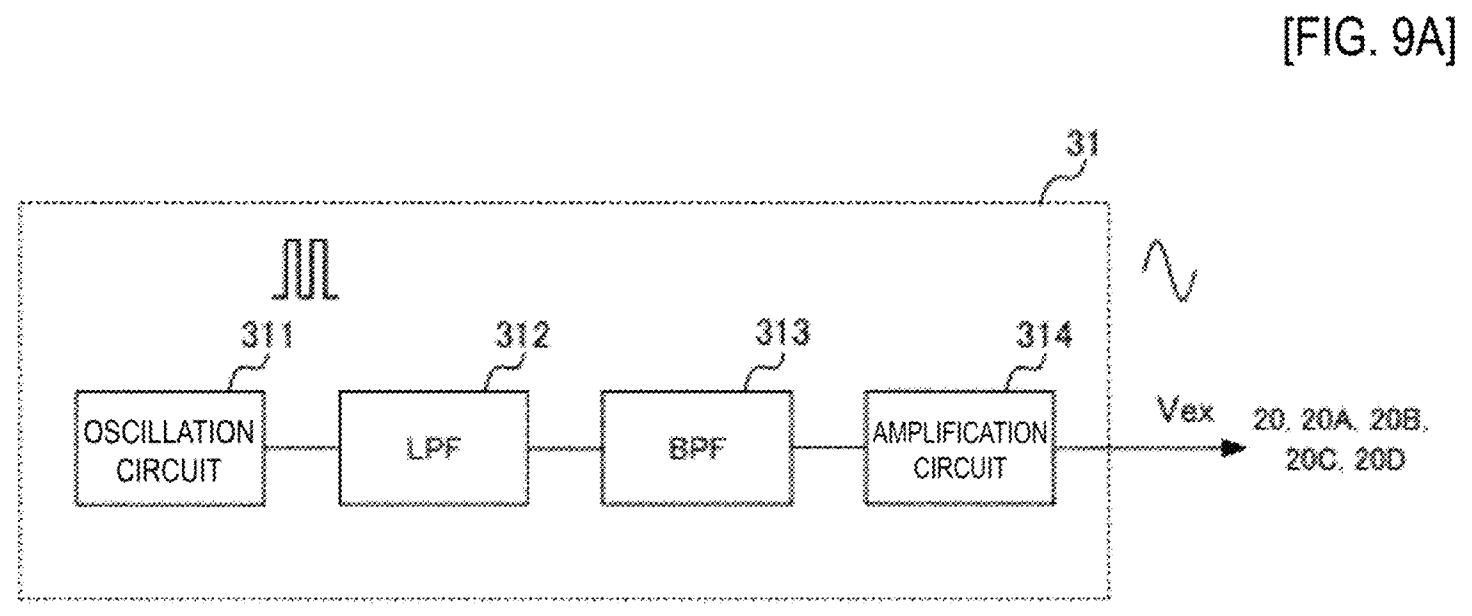

FIG. 9A is a circuit diagram illustrating an example of a configuration of the signal supplier 31 according to the fourth embodiment. The signal supplier 31 according to the fourth embodiment supplies the AC excitation voltage Vex to, for example, the excitation circuit 20 among the excitation circuits 20 to 20D.

As illustrated in FIG. 9A, the signal supplier 31 includes an oscillation circuit 311, a low-pass filter 312, a bandpass filter 313, and an amplification circuit 314.

The oscillation circuit 311 generates a clock signal. The oscillation circuit 311 outputs the generated clock signal to the low-pass filter 312.

The low-pass filter 312 attenuates a high-frequency component of the clock signal output from the oscillation circuit 311 and allows a low-frequency component to pass through. The low-pass filter 312 outputs, to the bandpass filter 313, an LP signal obtained by performing a filtering process for allowing a low-frequency component to pass through on the clock signal.

The bandpass filter 313 allows a specific frequency component of the LP signal output from the low-pass filter 312 to pass through. The bandpass filter 313 outputs, to the amplification circuit 314, a sinusoidal signal obtained by performing a filtering process for allowing a specific frequency component to pass through on the LP signal.

The amplification circuit 314 amplifies the sinusoidal signal output from the bandpass filter 313, and supplies the amplified sinusoidal signal to the excitation circuit 20 as the AC excitation voltage Vex.

According to the fourth embodiment, by disposing the low-pass filter 312 in the signal supplier 31, it is possible to suppress input of a high-frequency component to the respective input terminals of the operational amplifiers 21 to 24. Accordingly, when the operational amplifiers 21 to 24 cannot follow a high-frequency component, spike-like noises caused in the output signals of the operational amplifiers 21 to 24 can be reduced.

In this way, the signal supplier 31 of the present example can reduce spike-like noises contained in the excitation current I1 and the excitation current I2 caused by the operational amplifiers 21 to 24 insufficiently following a high-frequency component of an input signal, as compared with a signal supplier not provided with the low-pass filter 312.

Figure 9B:
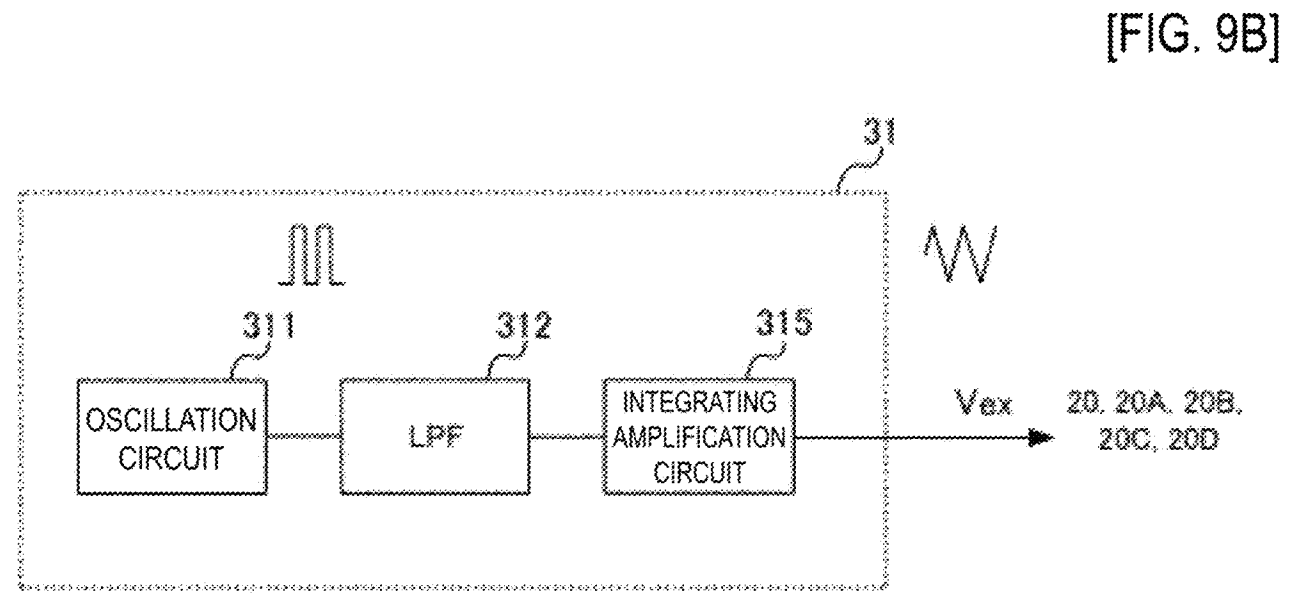

FIG. 9B is a circuit diagram illustrating another example of the signal supplier 31 according to the fourth embodiment.

In the present example illustrated in FIG. 9B, the signal supplier 31 supplies the AC excitation voltage Vex having a triangular wave to the excitation circuit 20. The signal supplier 31 includes an integrating amplification circuit 315 instead of the bandpass filter 313 and the amplification circuit 314 illustrated in FIG. 9A.

The integrating amplification circuit 315 integrates and amplifies an LP signal output from the low-pass filter 312. The integrating amplification circuit 315 supplies the integrated and amplified triangular wave signal to the excitation circuit 20 as the AC excitation voltage Vex.

Also in the present example, by disposing the low-pass filter 312 in the signal supplier 31, it is possible to suppress input of a high-frequency component to the respective input terminals of the operational amplifiers 21 to 24, as in the signal supplier 31 illustrated in FIG. 9A. Accordingly, when the operational amplifiers 21 to 24 cannot follow a high-frequency component, spike-like noises caused in the output signals of the operational amplifiers 21 to 24 can be reduced.

Next, a modification example of the measuring device 1 according to the first embodiment and the second embodiment will be described with reference to FIG. 10 to FIG. 12.

First Modification Example

Figure 10:
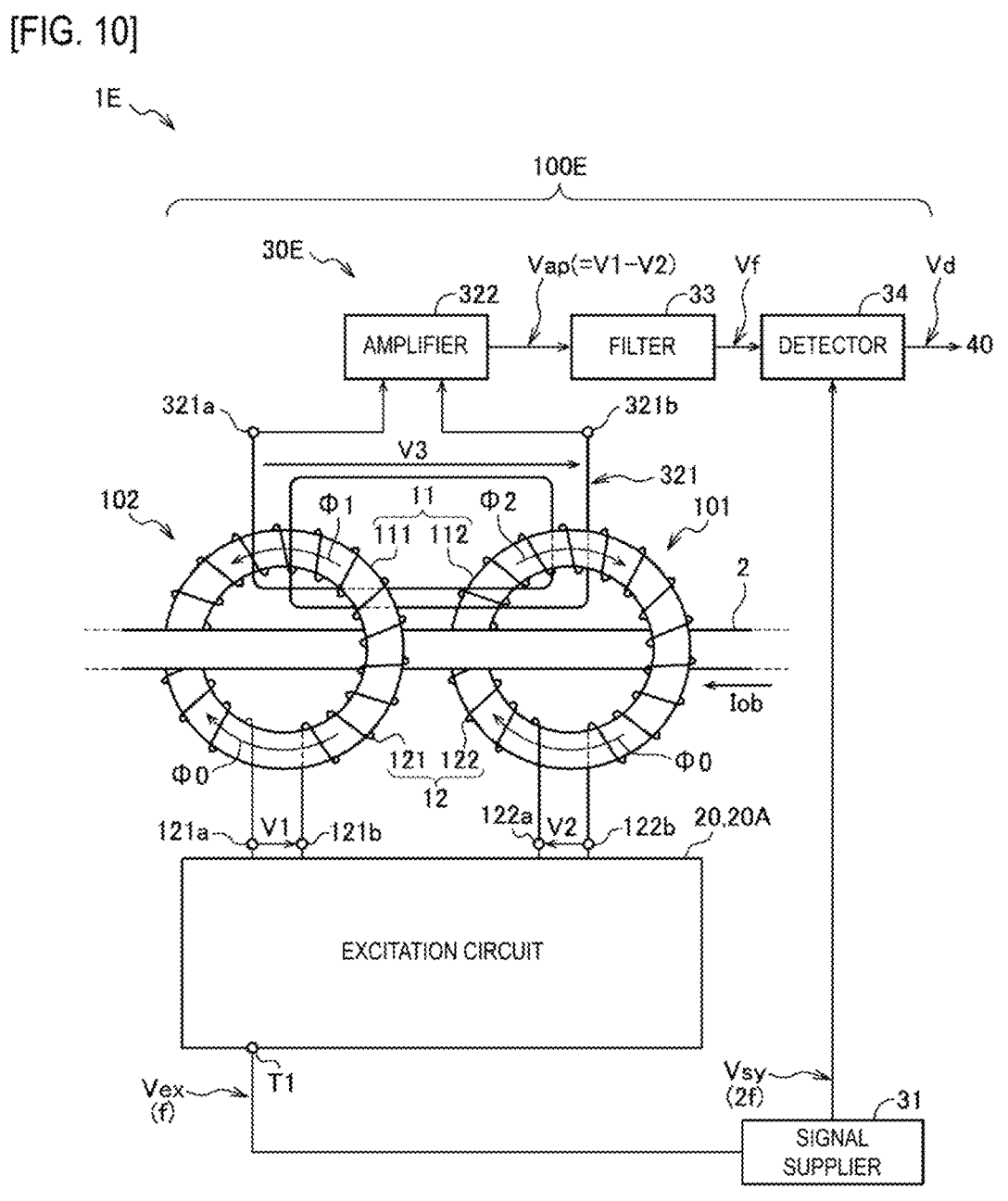

FIG. 10 is a diagram illustrating a configuration of a measuring device 1E according to a first modification example.

The measuring device 1E includes a current sensor 100E corresponding to the current sensor 100 illustrated in FIG. 1, and differs from the first embodiment to the third embodiment in a method for detecting a differential voltage between the induced voltage V1 and the induced voltage V2.

The current sensor 100E includes a detector 30E instead of the detector 30 of the current sensor 100 illustrated in FIG. 1. The detector 30E includes the signal supplier 31, the filter 33, and the detector 34 illustrated in FIG. 1, and a detection coil 321 and an amplifier 322.

The detection coil 321 is wound around the magnetic core 111 and the magnetic core 112 by a predetermined number of turns. With this configuration, the detection coil 321 generates, between a terminal 321a and a terminal 321b thereof, an induced voltage V3 which is a differential voltage (V1−V2) between the induced voltage V1 and the induced voltage V2.

The amplifier 322 amplifies the induced voltage V3 between both the terminals 321a and 321b of the detection coil 321 to a predetermined level. The amplifier 322 outputs an amplified signal Vap (=V1−V2) indicating the differential voltage between the induced voltage V1 and the induced voltage V2 to the filter 33.

As in the above-described embodiments, the filter 33 selectively allows the detection frequency 2f contained in the amplified signal Vap to pass through, thereby outputting the extracted signal Vf indicating the differential voltage between the induced voltage V1 and the induced voltage V2. The detector 34 synchronously detects the extracted signal Vf with the synchronized signal Vsy output from the signal supplier 31, thereby outputting the detection signal Vd indicating a current value of the measurement object current Iob flowing through the measurement object 2.

Also in the measuring device 1E provided with the current sensor 100E, as in the measuring device 1 illustrated in FIG. 1, it is possible to reduce a deviation from the reference phase difference of 180 degrees between the excitation current I1 flowing through the excitation coil 121 and the excitation current I2 flowing through the excitation coil 122. Accordingly, excitation noises of the detection signal Vd can be suppressed.

Note that the present modification example can also be applied to the configuration of the measuring device 1B in the third embodiment as well as the configurations of the first modification example and the second modification example of the measuring device 1B.

Second Modification Example

The pair of magnetic cores 11 in the above-described embodiments are configured to be arranged in a magnetic field (not illustrated) generated around the measurement object 2 by the measurement object current Iob flowing through the measurement object 2 in a state in which the measurement object 2 is inserted into the magnetic cores 11. However, the present invention is not limited to such a configuration.

FIG. 11 is a diagram illustrating a configuration of a current sensor 100F according to a second modification example.

The current sensor 100F of the second modification example is different from the above-described embodiments in that a core 13 different from a pair of flux gates 10F corresponding to the pair of flux gates 10 illustrated in FIG. 1 is separately provided.

As illustrated in FIG. 11, the core 13 is formed in an annular shape, and a gap GP is formed in a part of the annular shape. The pair of flux gates 10F are disposed in the gap GP of the core 13. The pair of flux gates 10F are composed of a magnetic core 114 around which an excitation coil 124 is wound and a magnetic core 115 around which an excitation coil 125 is wound.

In the present example, each of the magnetic core 114 and the magnetic core 115 is formed in a columnar shape, but may be formed in an annular shape instead. In addition, the current sensor 100F may have a configuration in which two gaps are formed in the core 13 and the magnetic core 114 and the magnetic core 115 are disposed in the gaps one by one.

In the current sensor 100F, the measurement object 2 is inserted into the core 13. In this state, the core 13 is arranged in a magnetic field (not illustrated) generated around the measurement object 2 by the measurement object current Iob flowing through.

A magnetic flux is generated in the core 13 due to the magnetic field generated around the measurement object 2. Since the magnetic flux passes through the gap GP, a magnetic flux is also generated in the magnetic core 114 and the magnetic core 115 disposed in the gap GP.

In addition, the current sensor 100F has a configuration in which the magnetic core 114 and the magnetic core 115 are arranged in a magnetic field (not illustrated) generated around the measurement object 2 by the measurement object current Iob flowing through, even in an aspect in which the measurement object 2 is not inserted into the core 13.

Note that in the present modification example, components other than the configuration in which the measurement object 2 is inserted into the core 13 including the magnetic core 114 and the magnetic core 115 disposed in the gap GP are the same as the components of any of the above-described embodiments. Thus, in FIG. 11, the same components are not illustrated and the descriptions thereof are omitted.

Even with the current sensor 100F having such a configuration, it is possible to achieve the same effects as those in the above-described embodiments. Note that the present modification example can be applied to each configuration of the above-described embodiments.

Third Modification Example

FIG. 12 is a diagram illustrating a configuration of a measuring device 1G according to a third modification example. The measuring device 1G includes a current sensor 100G of a zero flux type.

The current sensor 100G of the third modification example includes, in addition to the components of the current sensor 100 illustrated in FIG. 1, a pair of main cores 91, 92, a feedback winding 93, a drive circuit 94, a detection resistor 95, and an amplifier 96.

The main cores 91 and 92 each have a concave cross section and are formed into the same annular shape in a plan view using a magnetic material. With this configuration, in a state in which the main cores 91 and 92 are placed with their concave portions facing each other, the main cores 91 and 92 are configured as one annular core with an annular hollow portion (not illustrated) formed inside. In addition, the magnetic core 111 around which the excitation coil 121 is wound and the magnetic core 112 around which the excitation coil 122 is wound are accommodated in the hollow portion in a stacked state.

The feedback winding 93 is wound around the outer circumferential surface of the annular core composed of the pair of main cores 91, 92. The drive circuit 94 generates a drive current Id based on the detection signal Vd output from the detector 34 and supplies the drive current Id to one end of the feedback winding 93.

In addition, the drive circuit 94 controls the amplitude of the drive current Id so as to reduce (close to zero) the amplitude of the detection signal Vd output from the detector 34. As a result, a magnetic flux generated in the annular core composed of the pair of main cores 91, 92 when the drive current Id flows through the feedback winding 93 cancels a magnetic flux generated in the annular core when the measurement object current Iob flows through the measurement object 2.

The detection resistor 95 is connected between the other end of the feedback winding 93 and the ground potential G, and converts the drive current Id into a voltage signal Vd1. The amplifier 96 amplifies the converted voltage signal Vd1 to a voltage signal Vd2 and outputs the voltage signal Vd2 to the processor 40. The output voltage signal Vd2 is a signal whose voltage value changes in proportion to the current value of the measurement object current Iob flowing through the measurement object 2.

Even with the current sensor 100G, it is possible to achieve the same operation and effects as those in the above-described embodiments. Further, according to the current sensor 100G, the magnetic flux generated in the annular core composed of the pair of main cores 91, 92 can be maintained at substantially zero, and thus it is possible to measure the measurement object current Iob having a large current value while avoiding magnetic saturation.

Note that the present modification example can also be applied to the configuration of the measuring device 1B in the third embodiment as well as the configurations of the first modification example and the second modification example of the measuring device 1B.

Although each of the embodiments of the present invention has been described above, the embodiments merely illustrate part of application examples of the present invention, and there is no intention to limit the technical scope of the present invention to the specific configurations of the embodiments described above.

Although the excitation current I1 and the excitation current I2 have the same current value and the pair of excitation coils 12 have the same number of turns, the present invention is not limited thereto as long as the induced voltage V1 and the induced voltage V2 generated in the pair of excitation coils 12 by the AC excitation voltage Vex have the same magnitude.

For example, the current values of the excitation current I1 and the excitation current I2 may be different from each other. In that case, a ratio of the number of turns of the excitation coil 122 to the number of turns of the excitation coil 121 is set to the reciprocal of a ratio of the excitation current I2 to the excitation current I1.

Further, the phase adjustment circuit 210 may be omitted, or the gain adjustment variable resistor 242 or 244 may be changed from a fixed resistor to a variable resistor.

The present application claims priority based on JP 2022-023808 filed on Feb. 18, 2022, in Japan, the entire contents of which are incorporated by reference herein.

REFERENCE SIGNS LIST 1, 1B, 1E, 1G Measuring device
2 Measurement object
100, 100B, 100E to 100G Current sensor
200 Measurement section
10 Pair of flux gates
11 Pair of magnetic cores
101 Flux gate (first flux gate)
102 Flux gate (second flux gate)
111 Magnetic core
112 Magnetic core
121 Excitation coil (first coil)
122 Excitation coil (second coil)
20, 20A to 20D Excitation circuit
21 Operational amplifier (first operational amplifier)
22 Operational amplifier (second operational amplifier)
23, 23B to 23D Operational amplifier (third operational amplifier)
24, 24C, 24D Operational amplifier (fourth operational amplifier)
210 Phase adjustment circuit
220, 220D Voltage follower circuit (first amplification circuit)
220B Inverting amplification circuit (first amplification circuit)
220C Non-inverting amplification circuit (first amplification circuit)
230 Current adjustment resistor (first resistance element)
240 Inverting amplification circuit (second amplification circuit)
240C Non-inverting amplification circuit (second amplification circuit)

24

240D Voltage follower circuit (second amplification circuit)
242 Gain adjustment variable resistor (variable resistance element)
250 Current adjustment resistor (second resistance element)
260 Current adjustment resistor (resistance element)
30, 30E Detector (detection circuit)
301, 302, 301A to 301D, 302A to 302D Pair of excitation circuits
311 Oscillation circuit
312 Low-pass filter
Iob Measurement object current (physical quantity)
I1 Excitation current (first excitation current)
I2 Excitation current (second excitation current)
G Ground potential (reference potential)

The invention claimed is:

1. An excitation circuit exciting a pair of flux gates for detecting a physical quantity of a measurement object, the excitation circuit comprising:
a first operational amplifier configured to supply a first excitation current to a first coil constituting a first flux gate;
a second operational amplifier configured to supply a second excitation current to a second coil constituting a second flux gate; and,
a signal generation circuit configured to generate an input signal for the first operational amplifier and an input signal for the second operational amplifier,
the signal generation circuit including:
a third operational amplifier configured to generate an inverted voltage or a non-inverted voltage based on an AC excitation voltage for exciting the pair of the flux gates, as the input signal for the first operational amplifier; and,
a fourth operational amplifier configured to generate an inverted voltage or a non-inverted voltage based on the AC excitation voltage as the input signal for the second operational amplifier.

2. The excitation circuit according to claim 1, wherein:
the signal generation circuit further includes a phase adjustment circuit configured to adjust a phase of the input signal for the first operational amplifier; and,
the third operational amplifier generates the non-inverted voltage based on the AC excitation voltage; and,
the fourth operational amplifier generates the inverted voltage based on the AC excitation voltage.

3. The excitation circuit according to claim 2, wherein:
the phase adjustment circuit is connected between a circuit that outputs the AC excitation voltage and a non-inverting input terminal of the third operational amplifier.

4. The excitation circuit according to claim 2, wherein:
a variable resistance element configured to adjust an amplitude of the input signal for the second operational amplifier is connected between an inverting input terminal and an output terminal of the fourth operational amplifier.

5. The excitation circuit according to claim 2, wherein:
the pair of flux gates are disposed along a circumferential direction of the measurement object; and,
the first coil is wound in a same direction as the second coil.

6. The excitation circuit according to claim 5, wherein:
a non-inverting input terminal of the first operational amplifier is connected to an output terminal of the third operational amplifier;

a non-inverting input terminal of the second operational amplifier is connected to an output terminal of the fourth operational amplifier; and, inverting input terminals of the first operational amplifier and the second operational amplifier are connected to each other via a resistance element.

7. The excitation circuit according to claim 2, wherein:

the pair of flux gates are arranged along a circumferential direction of the measurement object;

the first coil is wound in an opposite direction to the second coil;

an inverting input terminal of the first operational amplifier is connected to an output terminal of the third operational amplifier via a first resistance element, and a non-inverting input terminal of the first operational amplifier is connected to a reference potential; and, an inverting input terminal of the second operational amplifier is connected to an output terminal of the fourth operational amplifier via a second resistance element, and a non-inverting input terminal of the second operational amplifier is connected to the reference potential.

8. The excitation circuit according to claim 7, wherein:
a first amplification circuit including the third operational amplifier and a second amplification circuit including the fourth operational amplifier have a same circuit configuration.

9. A current sensor comprising:
the excitation circuit according to claim 1; and,
a detection circuit configured to detect a magnitude of a current flowing through the measurement object based on an output signal of the first operational amplifier and an output signal of the second operational amplifier.

10. The current sensor according to claim 9, further comprising a supply circuit configured to supply the AC excitation voltage to the excitation circuit, wherein:
the supply circuit includes:
an oscillation circuit that generates a clock signal for generating the AC excitation voltage; and,
a low-pass filter that allows a low-frequency component of the clock signal output from the oscillation circuit to pass through.

11. A measuring device comprising:
the current sensor according to claim 9; and,
a measurement section configured to measure a physical quantity of the measurement object based on a detection signal detected by the current sensor.

* * * * *